United States Patent
Forbes

(10) Patent No.: US 7,282,762 B2
(45) Date of Patent: Oct. 16, 2007

(54) 4F² EEPROM NROM MEMORY ARRAYS WITH VERTICAL DEVICES

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 131 days.

(21) Appl. No.: 11/192,472

(22) Filed: Jul. 29, 2005

(65) Prior Publication Data

US 2005/0265063 A1 Dec. 1, 2005

Related U.S. Application Data

(62) Division of application No. 10/785,310, filed on Feb. 24, 2004, now Pat. No. 7,075,146.

(51) Int. Cl.
H01L 29/76 (2006.01)

(52) U.S. Cl. .................. 257/330; 257/324; 257/411; 257/E29.26; 438/259; 438/270; 438/272; 438/589

(58) Field of Classification Search ............. 257/330
See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,558,344 A | 12/1985 | Perlegos |
| 4,630,085 A | 12/1986 | Koyama |
| 4,755,864 A | 7/1988 | Ariizumi |
| 4,774,556 A | 9/1988 | Fujii |
| 4,785,199 A | 11/1988 | Kolodny |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |

(Continued)

FOREIGN PATENT DOCUMENTS

EP 84303740.9 1/1985

(Continued)

OTHER PUBLICATIONS

U.S. Appl. No. 10/738,783, filed Dec. 17, 2003, Forbes.

(Continued)

Primary Examiner—Tu-Tu V. Ho
(74) Attorney, Agent, or Firm—Leffert, Jay & Polglaze P.A.

(57) ABSTRACT

NROM EEPROM memory devices and arrays are described that facilitate the use of vertical NROM memory cells and select gates in NOR or NAND high density memory architectures. Memory embodiments of the present invention utilize vertical select gates and NROM memory cells to form NOR and NAND NROM architecture memory cell strings, segments, and arrays. These NROM memory cell architectures allow for improved high density memory devices or arrays with integral select gates that can take advantage of the feature sizes semiconductor fabrication processes are generally capable of and yet do not suffer from charge separation issues in typical multi-bit NROM cells. The memory cell architectures also allow for mitigation of disturb and overerasure issues by placing the NROM memory cells behind select gates that isolate the memory cells from their associated bit/data lines and/or source lines.

57 Claims, 13 Drawing Sheets

U.S. PATENT DOCUMENTS

| | | |
|---|---|---|
| 5,397,725 A | 3/1995 | Wolstenholme |
| 5,461,249 A | 10/1995 | Ozawa |
| 5,463,579 A | 10/1995 | Shimoji |
| 5,467,305 A | 11/1995 | Bertin |
| 5,576,236 A | 11/1996 | Chang |
| 5,620,913 A | 4/1997 | Lee |
| 5,734,609 A * | 3/1998 | Choi et al. ............. 365/185.17 |
| 5,768,192 A | 6/1998 | Eitan |
| 5,792,697 A | 8/1998 | Wen |
| 5,858,841 A | 1/1999 | Hsu |
| 5,888,868 A | 3/1999 | Yamazaki |
| 5,909,618 A | 6/1999 | Forbes |
| 5,911,106 A | 6/1999 | Tasaka |
| 5,936,274 A | 8/1999 | Forbes |
| 5,946,558 A | 8/1999 | Hsu |
| 5,966,603 A | 10/1999 | Eitan |
| 5,973,352 A | 10/1999 | Noble |
| 5,973,356 A | 10/1999 | Noble |
| 5,991,225 A | 11/1999 | Forbes |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,072,209 A | 6/2000 | Noble |
| 6,081,456 A | 6/2000 | Dadashev |
| 6,091,102 A | 7/2000 | Sekariapuram |
| 6,104,061 A | 8/2000 | Forbes |
| 6,108,240 A | 8/2000 | Lavi |
| 6,133,102 A | 10/2000 | Wu |
| 6,134,156 A | 10/2000 | Eitan |
| 6,134,175 A | 10/2000 | Forbes |
| 6,143,636 A | 11/2000 | Forbes |
| 6,147,904 A | 11/2000 | Liron |
| 6,150,687 A | 11/2000 | Noble |
| 6,153,468 A | 11/2000 | Forbes |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,191,470 B1 | 2/2001 | Forbes |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,164 B1 | 3/2001 | Noble |
| 6,208,557 B1 | 3/2001 | Bergemont |
| 6,215,702 B1 | 4/2001 | Derhacobian |
| 6,218,695 B1 | 4/2001 | Nachumovsky |
| 6,219,299 B1 | 4/2001 | Forbes |
| 6,222,768 B1 | 4/2001 | Hollmer |
| 6,222,769 B1 | 4/2001 | Maruyama |
| 6,238,976 B1 | 5/2001 | Noble |
| 6,240,020 B1 | 5/2001 | Yang |
| 6,243,300 B1 | 6/2001 | Sunkavalli |
| 6,249,460 B1 | 6/2001 | Forbes |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,337,808 B1 | 1/2002 | Forbes |
| 6,348,711 B1 | 2/2002 | Eitan |
| 6,377,070 B1 | 4/2002 | Forbes |
| 6,380,585 B1 | 4/2002 | Odanaka |
| 6,383,871 B1 | 5/2002 | Noble |
| 6,384,448 B1 | 5/2002 | Forbes |
| 6,392,930 B2 | 5/2002 | Jung |
| 6,417,049 B1 | 7/2002 | Sung |
| 6,417,053 B1 | 7/2002 | Kuo |
| 6,421,275 B1 | 7/2002 | Chen |
| 6,424,001 B1 | 7/2002 | Forbes |
| 6,429,063 B1 | 8/2002 | Eitan |
| 6,432,778 B1 | 8/2002 | Lai |
| 6,436,764 B1 | 8/2002 | Hsieh |
| 6,448,601 B1 | 9/2002 | Forbes |
| 6,448,607 B1 | 9/2002 | Hsu |
| 6,461,949 B1 | 10/2002 | Chang |
| 6,468,864 B1 | 10/2002 | Sung |
| 6,469,342 B1 | 10/2002 | Kuo |
| 6,476,434 B1 | 11/2002 | Noble |
| 6,477,084 B1 | 11/2002 | Eitan |
| 6,486,028 B1 | 11/2002 | Chang |
| 6,487,050 B1 | 11/2002 | Liu |
| 6,496,034 B2 | 12/2002 | Forbes |
| 6,498,377 B1 | 12/2002 | Lin |
| 6,514,831 B1 | 2/2003 | Liu |
| 6,531,887 B2 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,566,682 B2 | 5/2003 | Forbes |
| 6,576,511 B2 | 6/2003 | Pan |
| 6,577,533 B2 | 6/2003 | Sakui |
| 6,580,135 B2 | 6/2003 | Chen |
| 6,580,630 B1 | 6/2003 | Liu |
| 6,597,037 B1 | 7/2003 | Forbes |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,204 B2 | 9/2003 | Sung |
| 6,639,268 B2 | 10/2003 | Forbes |
| 6,642,572 B2 | 11/2003 | Kusumi |
| 6,657,250 B1 | 12/2003 | Rudeck |
| 6,680,508 B1 | 1/2004 | Rudeck |
| 6,720,216 B2 | 4/2004 | Forbes |
| 6,744,094 B2 | 6/2004 | Forbes |
| 6,762,955 B2 | 7/2004 | Sakui |
| 6,768,162 B1 | 7/2004 | Chang |
| 2001/0001075 A1 | 5/2001 | Ngo |
| 2001/0004332 A1 | 6/2001 | Eitan |
| 2001/0011755 A1 | 8/2001 | Tasaka |
| 2001/0022375 A1 | 9/2001 | Hsieh |
| 2001/0038118 A1 * | 11/2001 | Sakui et al. ................ 257/315 |
| 2002/0130356 A1 | 9/2002 | Sung |
| 2002/0142569 A1 | 10/2002 | Chang |
| 2002/0146885 A1 | 10/2002 | Chen |
| 2002/0149081 A1 | 10/2002 | Goda |
| 2002/0151138 A1 | 10/2002 | Liu |
| 2002/0177275 A1 | 11/2002 | Liu |
| 2002/0182829 A1 | 12/2002 | Chen |
| 2003/0042512 A1 | 3/2003 | Gonzalez |
| 2003/0043637 A1 | 3/2003 | Forbes |
| 2003/0057997 A1 | 3/2003 | Sun |
| 2003/0067807 A1 | 4/2003 | Lin |
| 2003/0113969 A1 | 6/2003 | Cho |
| 2003/0117861 A1 | 6/2003 | Maayan |
| 2003/0134478 A1 | 7/2003 | Lai |
| 2003/0235075 A1 | 12/2003 | Forbes |
| 2003/0235076 A1 | 12/2003 | Forbes |
| 2003/0235079 A1 | 12/2003 | Forbes |
| 2004/0016953 A1 | 1/2004 | Lindsay |
| 2004/0041203 A1 | 3/2004 | Kim |
| 2004/0063283 A1 | 4/2004 | Guterman |

2005/0032308 A1 2/2005 Hsiao

FOREIGN PATENT DOCUMENTS

| EP | 0 485 018 A2 | 11/1990 |
|---|---|---|
| EP | 90115805.5 | 2/1991 |
| EP | 0 562 257 A1 | 9/1993 |
| EP | 01113179.4 | 12/2002 |
| EP | 1 271 652 A | 1/2003 |
| JP | 01053577 | 1/1989 |
| JP | 05251711 | 9/1993 |

OTHER PUBLICATIONS

U.S. Appl. No. 10/738,556, filed Dec. 17, 2003, Forbes.
U.S. Appl. No. 10/769,116, filed Jan. 30, 2004, Forbes.
B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.
B. Eitan et al., "Spatial Characterization of Hot Carriers Injected into the Gate Dielectric Stack of a MOFSET Based on Non-Volatile Memory Device," date unknown, pp. 58-60.
B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.
E. Maayan et al., "A 512Mb NROM Flash Data Storage Memory with 8MB/s Data Range," Dig. IEEE Int. Solid-State Circuits Conf., San Francisco, (Feb 2002), pp. 1-8, Copyright Saifun Semiconductors Ltd. 2002.
E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.
M. Janai, "Data Retention, Endurance and Acceleration Factors of NROM Devices," IEEE 41st Annual International Reliability Physics Symposium, Dallas, TX (2003), pp. 502-505, Copyright 1989 IEEE.
S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.
C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.
P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.
W. Owen and W. Tchon, "E²PROM Product Issues and Technology Trends," IEEE 1989, pp. 17-19, Copyright 1989 IEEE.
T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256-258, Copyright 1998 IEEE.
B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.
T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.
F. Vollebregt, R. Cuppens, F. Druyts, G. Lemmen, F. Verberne, J. Solo, "A New E(E)PROM Technology With A $TiSi_2$ Control Gate," IEEE 1989, pp. 25.8.1-25.8.4, Copyright 1989 IEEE.
B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.
B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.
B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.
S. Ogura, et al. "Twin MONOS Cell with Dual Control Gates," Halo LSI and New Halo, pp. 187-187.3, Date Unknown.
T. Sugizaki, et al. "New 2-bit/Tr MONOS Type Flash Memory using $Al_2O_3$ as Charge Trapping Layer," Fujitsu Laboratories Ltd, Date Unknown.
T. Saito, et al. "Hot Hole Erase Characteristics and Reliability in Twin MONOS Device" Halo LSI, Date Unknown.
Saifun Semiconductors, Ltd. PowerPoint Presentation, Date Unknown.
Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.
W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.
W.J. Tsai, et al. "Data Retention Behavior of a SONOS Type Two-Bit Storage Flash Memory Cell," IEDM 01-0179-01-722, Copyright 2001 IEEE.
A. Shappir, et al., "Subtreshold slope degradation model for localized-charge-trapping based non-volatile memory devices," Solid-State Electronics 47 (2003), pp. 937-941. Copyright 2003 Elsevier Science Ltd.
Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.
J. H. Kim, et al., "Highly Manufacturable SONOS Non-Volatile Memory for the Embedded SoC Solution," 2003 Symposium on VLSI Technology Digest of Technical Papers, pp. 31-32.
Y. Hayashi, et al., "Twin MONOS Cell with Dual Control Gates," 2000 Symposium on VLSI Technology Digest of Technical Papers, 2000 IEEE, pp. 122-123.
M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.
T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.
I. Bloom, et al., "NROM™ NVM technology for Multi-Media Applications," Saifun Semiconductors, Ltd. Ingentix, Ltd. and Infineon Technologies, Date Unknown.
E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.
Y. Roizin, et al., "Retention Characteristics of *micro*FLASH® Memory (Activation Energy of Traps in the ONO Stack)," Tower Semiconductor, Ltd., Date Unknown.
Y. Roizin, et al., "Activation Energy of Traps in the ONO Stacks of *micro*FLASH® Memory Cells," Tower Semiconductor, Ltd., Date Unknown.
Y. Roizin, et al., "'Dummy' Gox for Optimization of *micro*FLASH® Technology," Tower Semiconductor, Ltd., Date Unknown.
Y. K. Lee, et al., "Multi-Level Vertical Channel SONOS Nonvolatile Memory on SOI," 2002 Symposium on VLSI Technology Digest of Technical Papers, Copyright 2002 IEEE.
T. Saito, et al., "CHE Program Behavior in MONOS Device," Halo LSI., Date Unknown.
J. Bu, et al., "Retention Reliability Enhanced SONOS NVSM with Scaled Programming Voltage," Microelectronics Lab., Date Unknown.
H. Tomiye, et al., "A novel 2-bit/cell MONOS memory device with a wrapped-control-gate structure that applies source-side hot-electron injection," 2002 Symposium in VLSI Technology Digest of Technical Papers, Copyright 2002 IEEE.

Certified Translation, "Flash cell that seeks to replace current technology introduced enabling both low cost high performance" Nikkei Microdevices, Nov. 1999, pp. 147-148.

P. Cappelletti, et al, "Failure Mechanisms of Flash Cell in Program/Erase Cycling", IEEE, 1994, IEDM, pp. 291-294.

H. Guan, et al, "On-Scaling of SST Split-Gate Flash Memory Technologies", Department of Electrical and Computer Engineering, University of California, Irvine, Final Report 1998-1999 for MICRO Project 98-080.

P. Pavan, et al, "Flash Memory Cells—an Overview" Proceedings of the IEEE, vol. 85, No. 8, Aug. 1997, pp. 1248-1271.

S. Jin Ho, et al, "Charge-to-Breakdown Characteristics of Thin Gate Oxide and Buried Oxide on SIMOX SOI Wafers", Journal of the Electrochemical Society, vol. 144, No. 1, Jan. 1997, pp. 375-378.

R. Neale, "AMD's MirrorBit—a big step in Flash progress," Electronic Engineering Design, V. 74, No. 906, pp. 47-50. Date Unknown.

I. Bloom, et al., "NROM™ -a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in microFLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiware, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

* cited by examiner

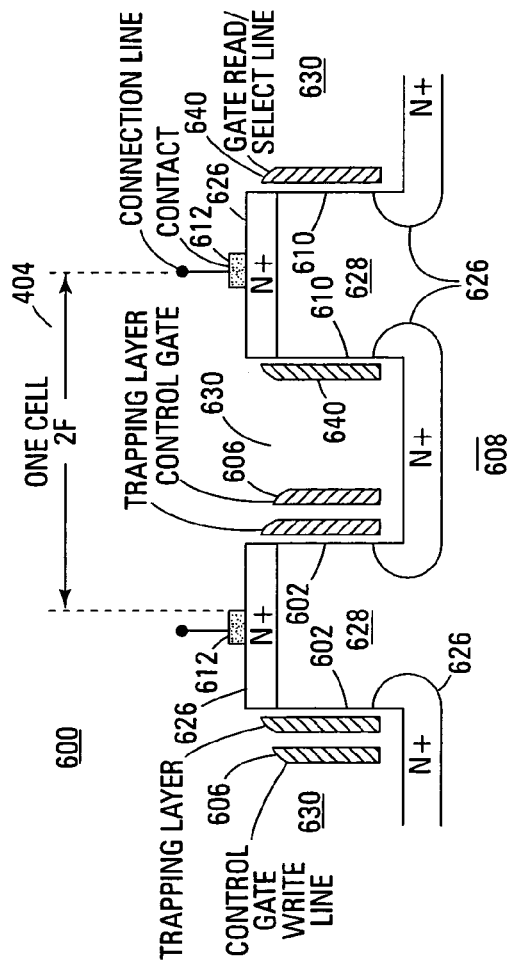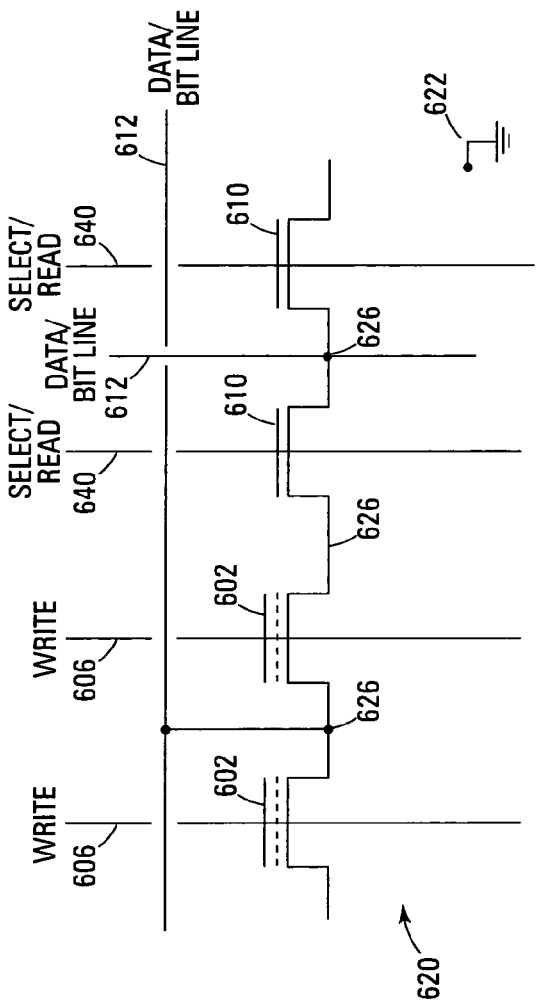

4F² EEPROM NROM MEMORY ARRAYS WITH VERTICAL DEVICES

RELATED APPLICATION

This is a divisional application of U.S. patent application Ser. No. 10/785,310, filed Feb. 24, 2004, titled "4F² EEPROM NROM MEMORY ARRAYS WITH VERTICAL DEVICES", which issued as U.S. Pat. No. 7,075,146, and is commonly assigned, the entire contents of which are incorporated herein by reference.

This application is further related to U.S. application Ser. No. 10/769,116, filed Jan. 30, 2004, entitled "VERTICAL DEVICE 4F² EEPROM MEMORY," which is commonly assigned.

TECHNICAL FIELD OF THE INVENTION

The present invention relates generally to integrated circuits and in particular the present invention relates to EEPROM memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

One recent type of Flash memory is a nitride read only memory (NROM). NROM has some of the characteristics of Flash memory but does not require the special fabrication processes of a conventional Flash memory, thus NROM integrated circuits can be implemented using a standard CMOS process. Because of their unique device characteristics, some NROM memory cells can also store multiple data bits in each cell (typically two bits each).

FIG. 1 illustrates a cross-sectional view of a typical prior art NROM memory cell with a channel length, L. The cell is comprised of a control gate 100 formed on top of an oxide-nitride-oxide (ONO) layer. This layer is comprised of an oxide layer 101 on top of a nitride 103 layer upon which the charge is stored for the various states of the cell. In one embodiment, the cell has trapping areas 105 and 106 for storing two bits of data on the nitride layer 103. The nitride layer 103 is deposited on another oxide layer 104 that is on the substrate.

Two source/drain regions 109 and 111 are at either end of the gate 100. The source/drain regions 109 and 111 are connected by a channel area 110 between the two source/drain regions 109 and 111. The function of each source/drain region 109 or 111 (i.e., whether source or drain) depends upon which bit trapping area 105 or 106 is being read or written. For example, in a read operation, if the carrier is input at the left side source/drain region 111 and output from the right side region 109, the left side is the source 111 and the right side is the drain 109 and the data bit charge is stored on the nitride 103 at the source end 111 for bit trapping area 106.

As integrated circuit processing techniques improve, manufacturers try to reduce the feature sizes of the devices produced and thus increase the density of the IC circuits and memory arrays. In NROM memory arrays in particular, the channel length of the NROM memory cells that make up the memory array and spacing between memory cells in the strings have a large effect on the number of memory cells that can be placed in a given area and thus a direct impact on the density of the array and size of the resulting memory device. In addition, in many cases the feature sizes of the devices are limited by the device characteristics before the minimum feature size that the process is capable of is reached. In NROM devices in particular, as the channel length is reduced, a minimum size is typically reached that is primarily dictated by the device operational characteristics. FIG. 2 illustrates a typical prior art planar NROM device that has a channel length that is less than 100 nm. In this case, the channel length is so short that the trapping areas 205 and 206 of the two data bits/cell NROM device overlap. This overlap may cause data write and read errors.

A further problem in floating gate and NROM memory cell arrays is the issue of overerased memory cells. An NROM memory cell is structurally similar to a MOSFET transistor, with a control gate separated from a channel, source, and drain by an insulator. In addition, embedded in the insulator is an isolated trapping layer. As in a MOSFET transistor, current flows when the NROM memory cell/transistor is selected or activated, charge trapped on the trapping layer affects the amount of current flow in the NROM transistor, depending on its direction of operation (current flow in the channel), effectively raising or lowering its threshold in the direction of operation. In programming or erasing an NROM memory cell, charge is transported to or from the electrically insulated trapping layer of the NROM transistor. If too much charge is removed from the trapping layer of the NROM transistor/memory cell it will flow current in this direction of operation even when it is not selected. NROM transistors in this overerased state can affect current flow on shared bitlines and/or memory strings and thus potentially corrupt data read from other memory cells these common bitlines and/or memory strings.

For the reasons stated above, and for other reasons stated below which will become apparent to those skilled in the art upon reading and understanding the present specification, there is a need in the art for a method and architecture for producing a more closely spaced and, thus, higher density NROM memory array without trapping area overlap and with improved overerasure handling properties.

SUMMARY OF THE INVENTION

The above-mentioned problems with producing a more closely spaced and higher density NROM memory array with improved overerasure handling properties and other problems are addressed by the present invention and will be understood by reading and studying the following specification.

NROM EEPROM memory devices and arrays, in accordance with embodiments of the present invention, facilitate the utilization of vertical NROM memory cells and select gates in NOR or NAND high density memory architectures. Memory embodiments of the present invention utilize vertical select gates and NROM memory cells to form NOR and NAND NROM architecture memory cell strings, segments, and arrays. These NROM memory cell architectures allow for an improved high density memory devices or arrays with integral select gates that can take advantage of the feature sizes semiconductor fabrication processes are generally capable of and yet do not suffer from charge separation issues in typical multi-bit NROM cells. The memory cell architectures also allow for mitigation of disturb and overerasure issues by placing the NROM memory cells behind select gates that isolate the memory cells from their associated bit/data lines.

For one embodiment, the invention provides a memory device comprising a NOR architecture NROM memory array formed on a substrate having a plurality of pillars and associated intervening trenches. A plurality of memory cell structures, each memory cell structure comprising, an NROM memory cell is formed vertically on a first sidewall of a trench. A select gate is formed on a second sidewall of the trench. The select gate is coupled to the NROM memory cell by a first source/drain region formed at the bottom of the trench.

For another embodiment, the invention provides an NROM memory cell structure comprising a substrate, having two raised areas, defining a trench therebetween. An NROM memory cell is formed vertically on a first sidewall of the trench, and a select gate memory cell is formed vertically on a second sidewall of the trench. The NROM memory cell is coupled to the select gate by source/drain regions at the bottom of the trench.

For yet another embodiment, the invention provides a method of forming an NROM memory cell structure comprising forming two raised areas on a substrate, the raised areas defining an associated intervening trench. The method further includes forming an NROM memory cell on a first sidewall of the trench, forming a select gate on a second sidewall of the trench, and forming a source/drain region at the bottom of the associated intervening trench.

For a further embodiment, the invention provides a NAND architecture NROM memory cell string comprising a substrate, comprising one or more raised areas, defining trenches therebetween. A plurality of NROM memory cells are formed vertically on the sidewalls of the trenches and are coupled in a serial string by source/drain regions formed at the top of the one or more raised areas and at the bottom of the one or more trenches. Additionally, a first NROM memory cell of the string is coupled to a first select gate.

For yet a further embodiment, the invention provides a memory array comprising a substrate having a plurality of pillars and associated intervening trenches. A plurality of NROM memory cells are formed vertically on the sidewalls of the plurality of pillars and trenches, wherein the plurality of NROM memory cells are coupled into a plurality of NAND architecture memory strings by source/drain regions formed at the top of the plurality of pillars and at the bottom of the associated trenches. Additionally, a first NROM memory cell of each NAND architecture memory string is coupled to a first vertical select gate and a last NROM memory cell of each NAND architecture memory string is coupled to a second vertical select gate.

For another embodiment, the invention provides a method of forming a NAND architecture memory cell string comprising forming one or more raised areas on a substrate, the raised areas defining associated intervening trenches. The method further includes forming a plurality of NROM memory cells on the sidewalls of the one or more raised areas, forming one or more source/drain regions on the top of the one or more raised areas and at the bottom of the one or more associated intervening trenches, and forming a first vertical select gate coupled to a first NROM memory cell of the string and a second vertical select gate coupled to a last NROM memory cell of the string.

Other embodiments are also described and claimed.

BRIEF DESCRIPTION OF THE DRAWINGS

FIGS. 6A-6C detail vertical NOR NROM memory array and cells in accordance with embodiments of the present invention.

DETAILED DESCRIPTION OF THE INVENTION

Figure 1:
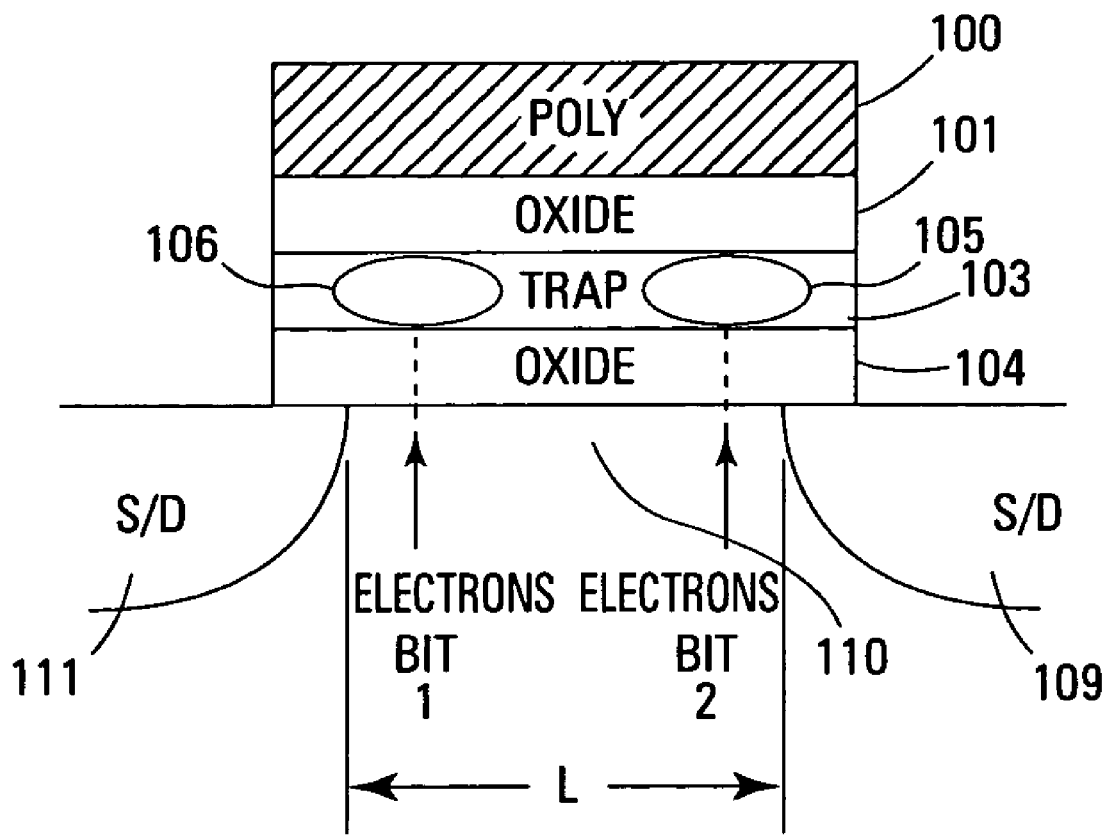
FIG. 1 shows a cross-sectional view of a typical prior art NROM cell.
Figure 2:
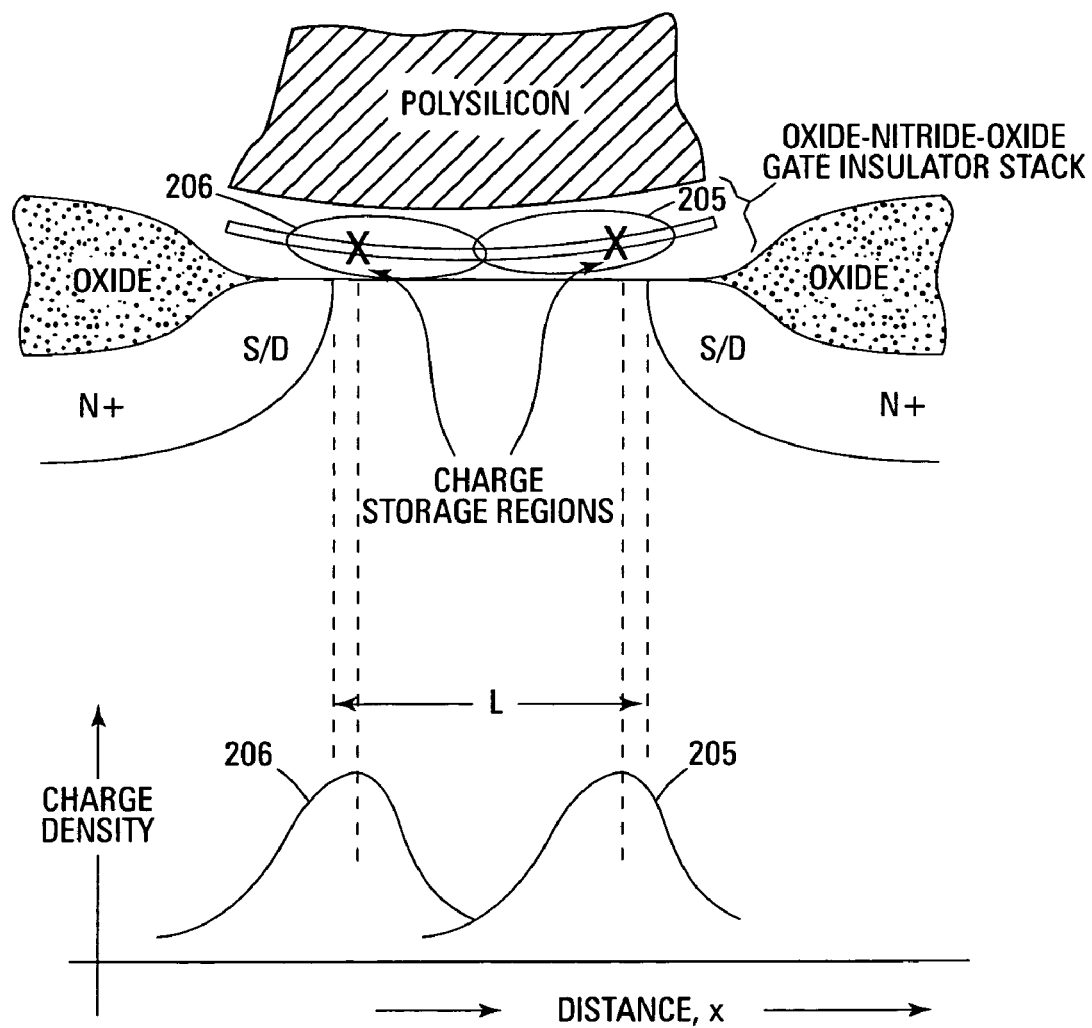
FIG. 2 shows a cross-sectional view of a typical prior art NROM cell with a channel less than 100 nm.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

NROM EEPROM memory devices and arrays, in accordance with embodiments of the present invention, facilitate the utilization of vertical NROM memory cells and select gates in NOR or NAND high density memory architectures. Memory embodiments of the present invention utilize vertical select gates and NROM memory cells to form NOR and NAND NROM architecture memory cell strings, segments, and arrays. These NROM memory cell architectures allow for improved high density memory devices or arrays with integral select gates that can take advantage of the feature sizes semiconductor fabrication processes are generally capable of and yet do not suffer from charge separation issues in typical multi-bit NROM cells. By constructing NROM memory cells/gates in a vertical orientation, embodiments of the present invention allow for increases in memory array cell density and improved utilization of process minimum feature size capabilities while maintaining an appropriate NROM memory cell channel length to allow for effective charge separation. The memory cell architectures also allow for mitigation of disturb and overerasure issues by placing the NROM memory cells behind select gates that isolate the memory cells from their associated bit/data lines and/or source lines.

As stated above, as integrated circuit processing techniques improve, manufacturers try to reduce the feature sizes of the devices produced and thus increase the density of the IC circuits and memory arrays. In many cases, the feature sizes of the devices are limited by the device characteristics before the minimum feature size that the process is capable of is reached. In both NAND and NOR architecture NROM EEPROM memory arrays, as the channel length is reduced and the spacing between memory cells in the strings are reduced, a minimum size is reached that is dictated by the operational characteristics of the NROM memory cell devices that make up the memory array. As a result, the maximum density of an array of memory cells is limited even if the process technology can attain even smaller features and/or channel lengths. In particular, this is an issue in higher capacity memory types where small changes in the memory cell footprint (e.g., memory cell channel widths) and the cell density in the array can have a large effect on the overall array size and the resulting storage capacity.

As stated above, programming an NROM memory cell involves the insertion and storage of charge on the memory cell's trapping layer. However, as also stated above, because of their unique device characteristics, NROM memory cells can also store multiple data bits in each cell, storing a data bit in the trapping layer of the device near each source/drain region for two bits in a typical NROM memory cell transistor. In this, an NROM memory cell transistor is read and programmed in both a forwards and backwards direction of current flow in the source/drain regions (interchanging their source/drain function) to allow access to programming, reading, and erasing the two stored data bits. The function of each source/drain region (i.e., whether source or drain) depends upon which bit trapping area is being read or written. For example, in a read operation, if the carrier is input at the left side source/drain region and output from the right side region, the left side is the source and the right side is the drain and the data bit charge is stored on the nitride at the source end for bit trapping area. Because of the localized storage of electrons in the trapping layer, while reading the NROM memory cell only the charge stored in the trapping layer nearest the source/drain region operating as the source affects the current flow through the device. The charge stored near the other source/drain region is "read through" and has minimal influence. The bits in an NROM memory cell transistor are programmed in the reverse bias/current flow direction from the read direction for each stored data bit.

Typically, an NROM memory cell electrically operates as an enhancement type MOS transistor, requiring a positive voltage applied across the gate and channel to flow current. The presence, or lack thereof, of a trapped charge on the trapping layer of the NROM transistor/memory cell near the source/drain region biased as the drain alters the threshold voltage characteristics of this transistor in this bias direction and thus the amount of current the transistor will flow at a given gate channel voltage. The effective threshold voltage of the NROM transistor memory cell in the selected bias direction increases with storage of electrons on the trapping layer near the source/drain region operating as the source and decreases with the removal of stored charge. Reading NROM memory cells in EEPROM memory arrays is then accomplished by accessing a memory cell with selected read voltage levels on the control gate and data/bit line coupled to the source/drain region biased as the source. The stored data is then typically sensed from the amount of current the NROM memory cell flows through the coupled bit/data line coupled to the source/drain region biased as the drain.

In programming NROM memory cells in EEPROM memory arrays, electrons are typically transferred to the trapping layer of the memory cell by one of Fowler-Nordheim tunneling (FN-Tunneling) or channel hot electron injection (HEI). Other forms of programming NROM memory cells, such as, substrate enhanced hot electron injection (SEHE), are also known and utilized, but may not be appropriate for multi-bit operation. FN-Tunneling is typically accomplished by applying a positive control gate voltage on the NROM memory cell with respect to its channel to tunnel inject electrons to the trapping layer. Channel hot electron injection (HEI) is typically accomplished by applying a positive voltage on the control gate and the source/drain region biased as the drain of the NROM memory cell and a low voltage or ground on the source/drain region biased as the source to inject electrons to the trapping layer. In many cases the programming voltages are iteratively pulsed and the memory cell read to check the programming process and more accurately program the NROM memory cell.

Erasure of the NROM memory cells of EEPROM memory arrays is typically accomplished by conventional tunneling or negative voltages applied to the control gate voltages with respect to the channel. Alternatively, other forms of erasure, such as, substrate enhanced band to band tunneling induced hot hole injection (SEBBHH) can also be used for NROM memory cell erasure, but again, may not by suitable for multi-bit operation. To ensure uniformity, in many cases the EEPROM memory programs all the NROM memory cells in the data segment to be erased before applying the voltages to erase the memory cells. As with programming, the erasure voltages are typically iteratively pulsed and the memory cells checked after each pulse to verify erasure and return of the NROM memory cells to an un-programmed threshold voltage state.

Unfortunately, it is possible, during an erasure process, for too much charge to be removed from the trapping layer or individual trapping areas of an NROM memory cell transistor placing it in to an "overerased" state. In such cases, enough charge is removed that the threshold voltage of the NROM memory cell transistor is altered so that it operates as a depletion mode device, requiring a negative control gate-channel voltage to be applied to shut off current flow in the selected bias direction. In this state, the NROM memory cell transistor will flow a current even when it has not been selected by the memory, unless a negative voltage is applied to the control gate with respect to the source. This "overerased" state and the resulting current flow in the selected bias direction when the overerased NROM memory cell is unselected can interfere with attempts to read the values of other NROM memory cells that share the common bit lines with it, corrupting the read data.

Complicating the issue of overerasure in NROM memory cells is that not all NROM memory cells erase (remove charge from their trapping layers or trapping areas) at the same rate of speed. Typically, one or more "fast erasing" memory cells will erase more quickly than the others of the group of cells selected for erasure. To minimize the possibility of inadvertently overerasing this group of fast erasing NROM memory cells most NROM EEPROM and Flash memory devices/arrays typically utilize the complex and time consuming iterative erase voltage pulse-memory cell verify process noted above to erase its NROM memory cells.

Figure 3A:
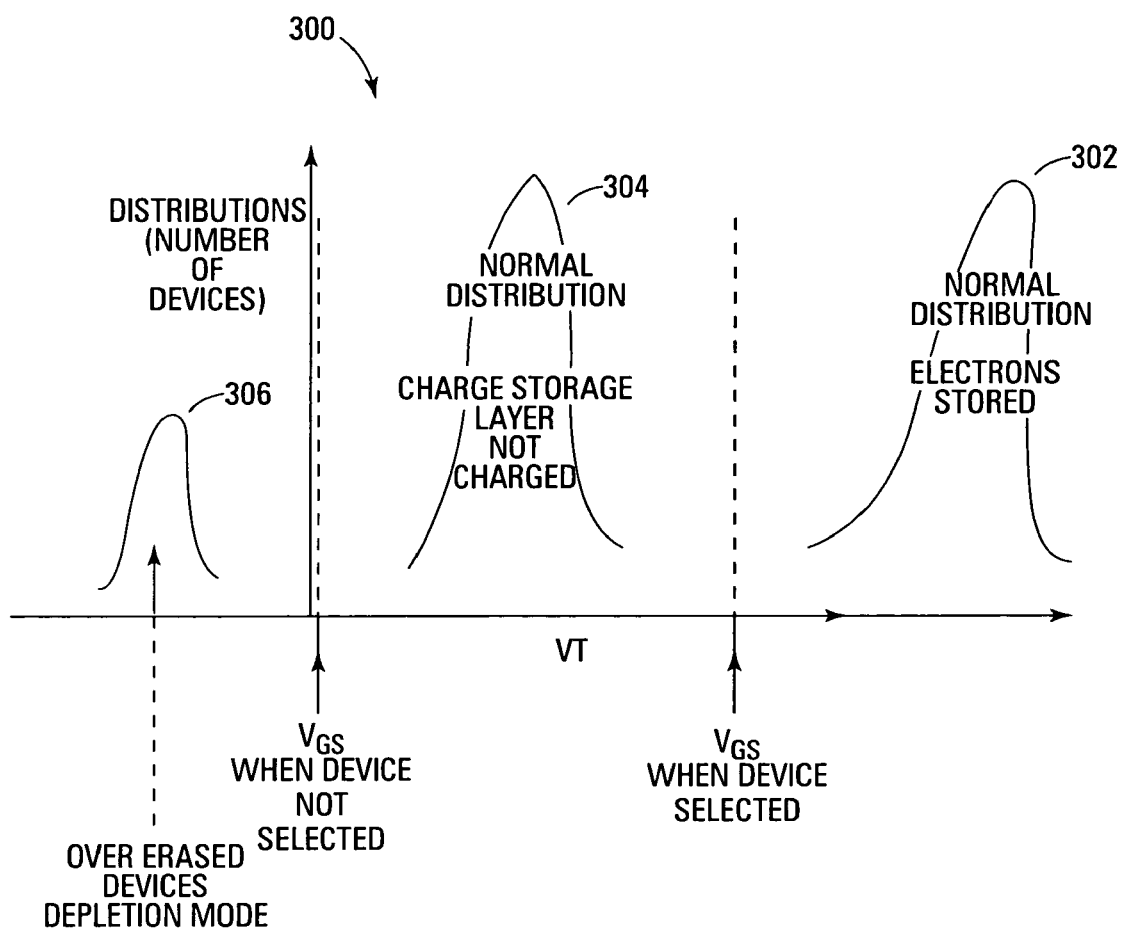
FIGS. 3A and 3B detail erase operations in NROM memory cells.
Figure 3B:
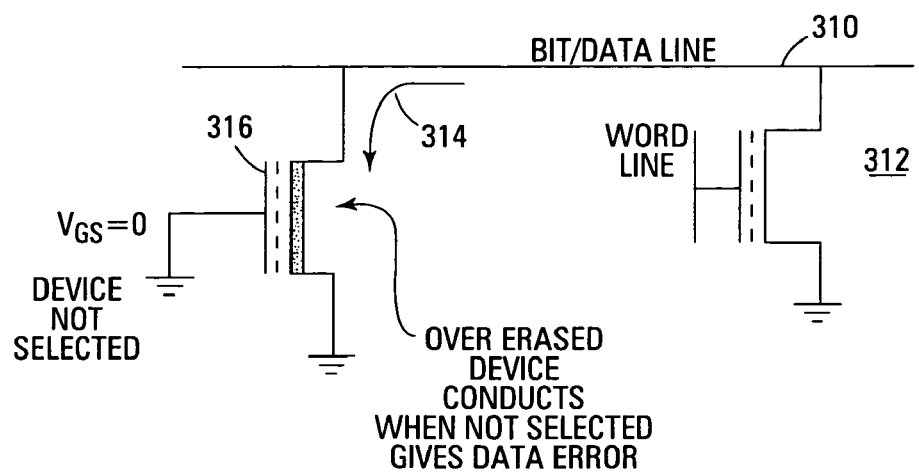

FIG. 3A details a chart of a distribution of threshold voltages 300 of NROM memory cells in a given array, showing distribution bell curves of the threshold voltages of NROM memory cells placed in a programmed 302 and erased 304 state in a given bias direction as may be typical of an NROM memory device. FIG. 3A also details a number of erased cells that have been inadvertently placed in an overerased (depletion mode) 306 state. FIG. 3B details a bit line 310 of a memory array 312 and the current flow 314 through an overerased NROM memory cell 316 that has not been selected/activated for reading.

An additional issue that can affect the memory cells of an EEPROM or Flash memory array is "disturb." Disturb typically happens when the elevated voltages used to program or erase an NROM memory cell segment or erase block "disturb" the programmed values stored in other trapping areas of other NROM memory cells corrupting them and causing errors when they are later read. These inadvertently disturbed cells typically share common word lines, bit lines, or source lines with the memory cells that are being programmed or erased.

By constructing their NROM memory cells vertically and isolating them with select gates, embodiments of the present invention allow for increases in memory array cell density and improved utilization of process minimum feature size capabilities, while maintaining the size of the memory cell channel to allow for appropriate device operation. In addition, by increasing the available surface area for transistors and incorporating select gates, which are also constructed in a vertical manner, embodiments of the present invention mitigate issues with overerasure and disturb, allowing for greater reliability and faster programming and erasure.

As previously stated, the two common types of EEPROM and Flash memory array architectures are the "NAND" and "NOR" architectures, so called for the similarity each basic memory cell configuration has to the corresponding logic gate design. In the NOR array architecture, the NROM memory cells of the memory array are arranged in a matrix similar to RAM or ROM. The gates of each NROM memory cell of the array matrix are coupled by rows to word select lines (word lines) and their source/drain regions are coupled to column bit lines. The NOR architecture NROM memory array is accessed by a row decoder activating a row of NROM memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

A NAND array architecture also arranges its array of NROM memory cells in a matrix such that the gates of each NROM memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture NROM memory array is accessed by a row decoder activating a row of NROM memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each NROM memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory.

Figure 4A:
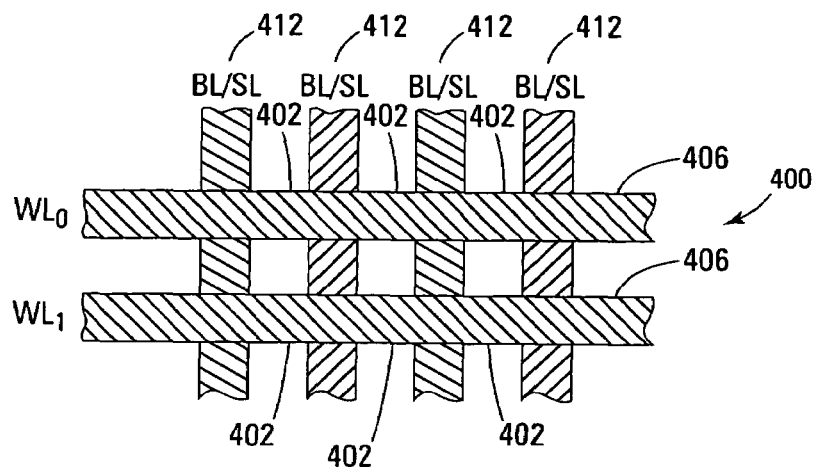
FIGS. 4A-4C detail a planar NAND NROM memory array of the prior art.
Figure 4B:
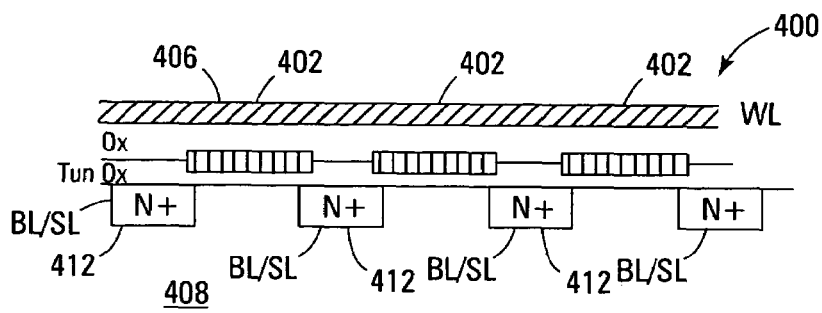
Figure 4C:
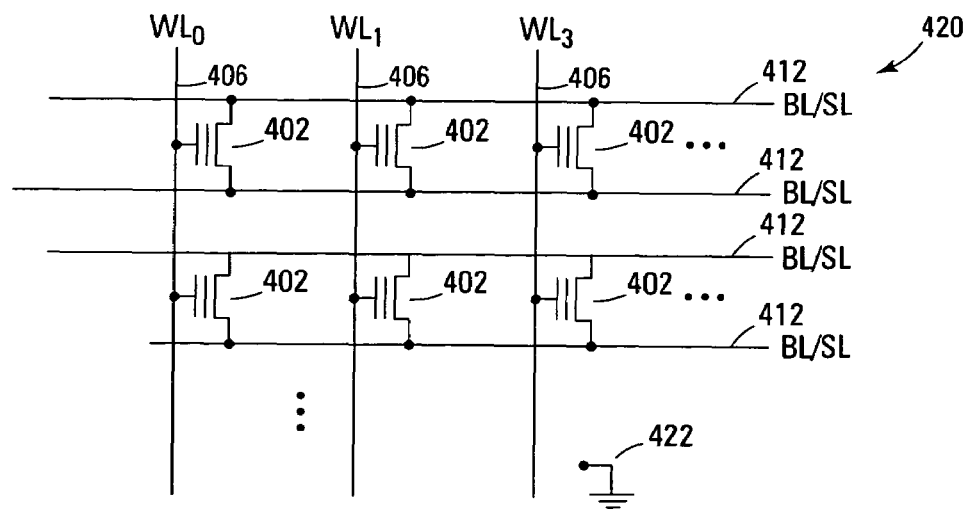

FIGS. 4A, 4B, and 4C show a simplified planar NROM memory array of a EEPROM or Flash memory device of the prior art. FIG. 4A details a top view of a planar NOR architecture NROM memory array 400, a side view of the planar NROM memory array 400 is detailed in FIG. 4B. In FIGS. 4A, 4B, and 4C, NROM memory cells 402 are coupled together in a NOR architecture memory array having bit lines 412 and word lines 406. The bit/source lines 412 are formed locally from N+ doped regions deposited in the substrate 408. Each NROM memory cell 402 has a gate-insulator stack formed between the N+ doped regions of a bit line 412, utilizing the N+ doped regions as a drain and source respectively. The gate-insulator stack is made of an insulator on top of a substrate 408, a trapping layer formed on the insulator, an intergate insulator formed over the trapping layer, and a control gate 406 (typically formed integral to the word line 406, also known as a control gate line) formed over the intergate insulator. FIG. 4C details an equivalent circuit schematic 420 of the NOR architecture NROM memory array 400, showing NROM memory cells 402 coupled to the bit lines, word lines, and substrate connection 422.

Figures 5A, 5B:
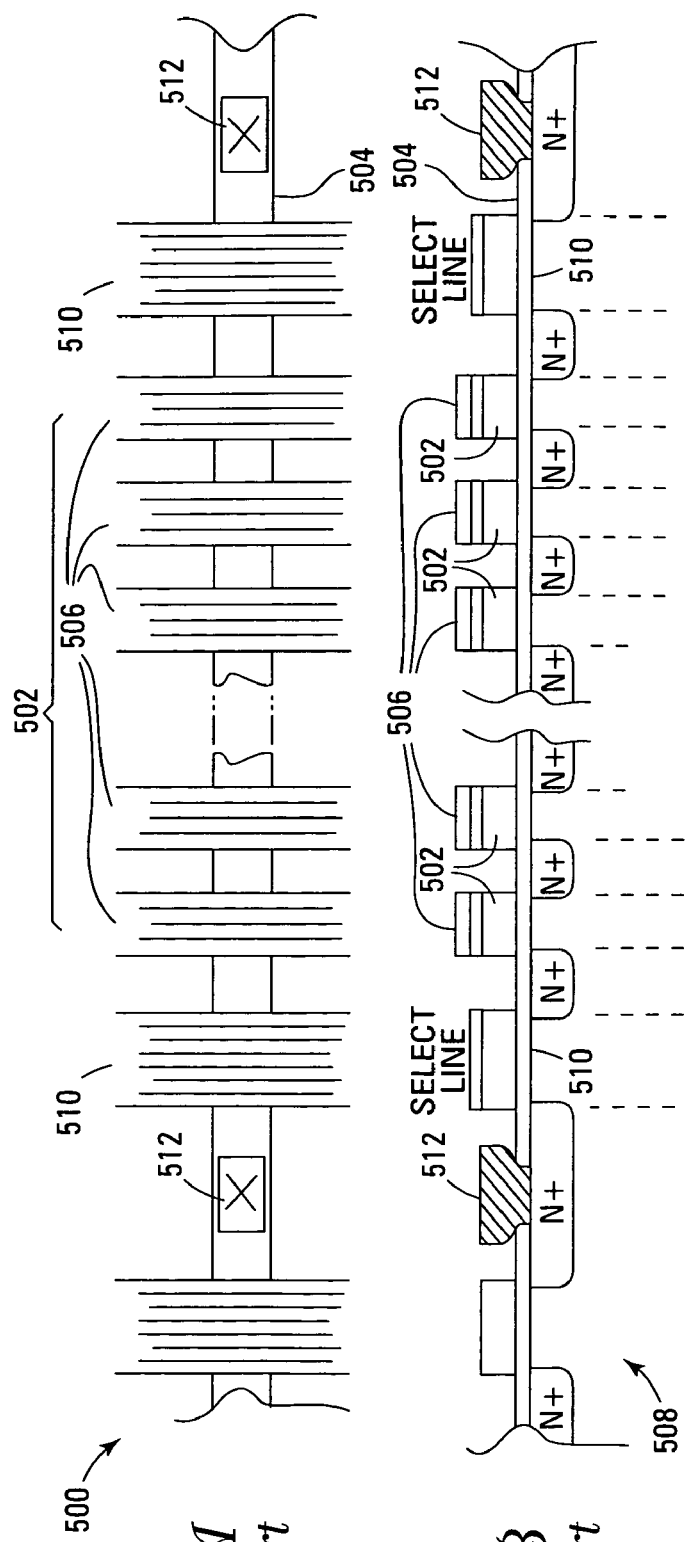
FIGS. 5A-5C detail a planar NOR NROM memory array of the prior art.
Figure 5C:
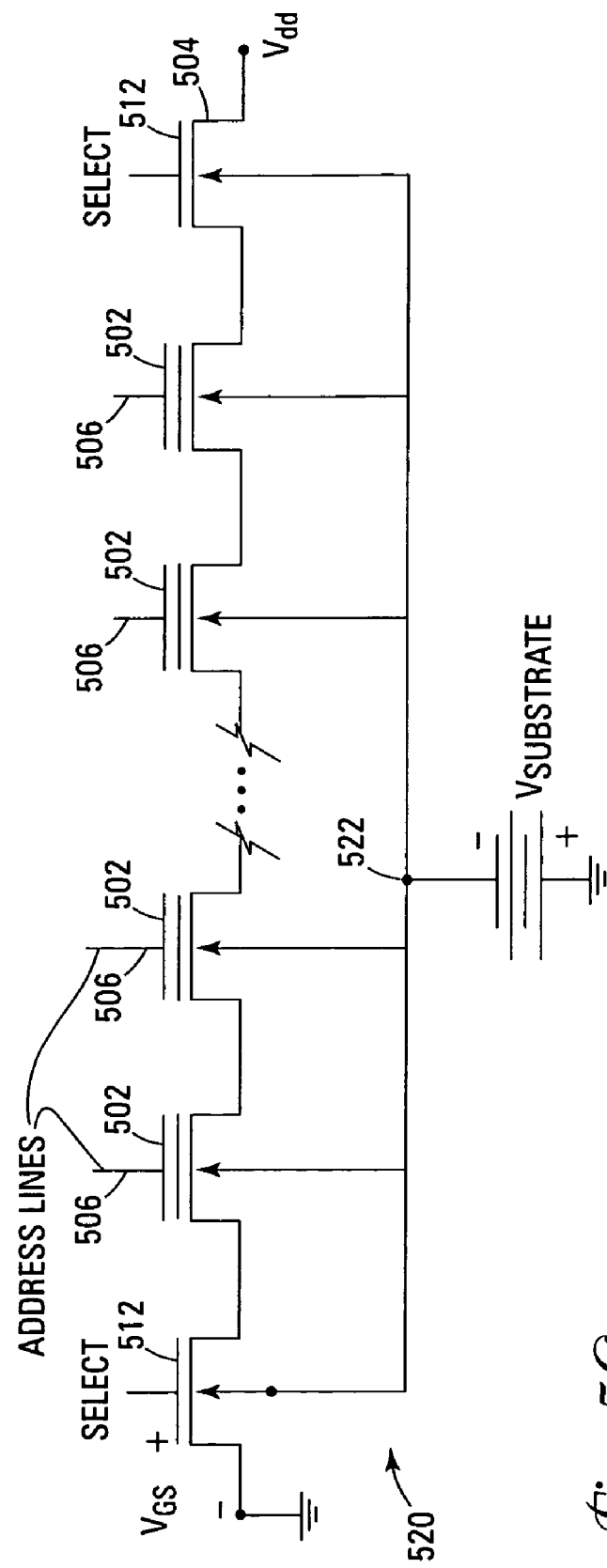

FIGS. 5A, 5B, and 5C show a simplified planar NAND NROM memory array of a EEPROM or Flash memory device of the prior art. FIG. 5A details a top view of a planar NAND NROM memory string 504 of a NAND architecture NROM memory array 500, a side view of the planar NAND NROM memory string 504 is detailed in FIG. 5B. In FIGS. 5A and 5B, a series of NROM memory cells 502 are coupled together in a series NAND string 504 (typically of 8, 16, 32, or more cells). Each NROM memory cell 502 has a gate-insulator stack that is made of an insulator on top of a substrate 508, a trapping layer formed on the insulator, an intergate insulator formed over the trapping layer, and a control gate 506 (typically formed in a control gate line, also known as a word line) formed over the intergate insulator.

N+ doped regions are formed between each gate insulator stack to form the source/drain regions of the adjacent NROM memory cells, which additionally operate as connectors to couple the cells of the NAND string 504 together. Select gates 510, that are coupled to gate select lines, are formed at either end of the NAND NROM string 504 and selectively couple opposite ends of the NAND NROM string 504 to a bit line contacts 512. FIG. 5C details an equivalent circuit schematic 520 of the NAND architecture NROM memory string 504, showing NROM memory cells 502 and substrate connection 522.

Embodiments of the present invention utilize vertical NROM memory cells and vertical gate structures. Methods of forming vertical memory cells are detailed in U.S. patent application Ser. No. 10/177,208, titled "Vertical NROM having a storage density of 1 bit per $1F^2$", filed Jun. 21, 2002, and U.S. Pat. No. 5,936,274, titled "High density flash memory", issued Aug. 10, 1999, which are commonly assigned. Methods of forming vertical split control gates are detailed U.S. Pat. No. 6,150,687, titled "Memory cell having a vertical transistor with buried source/drain and dual gates", issued Nov. 21, 2000, and U.S. Pat. No. 6,072,209, titled "Four $F^2$ folded bit line DRAM cell structure having buried bit and word lines", issued Jun. 6, 2000, which are also commonly assigned.

Figure 6A:
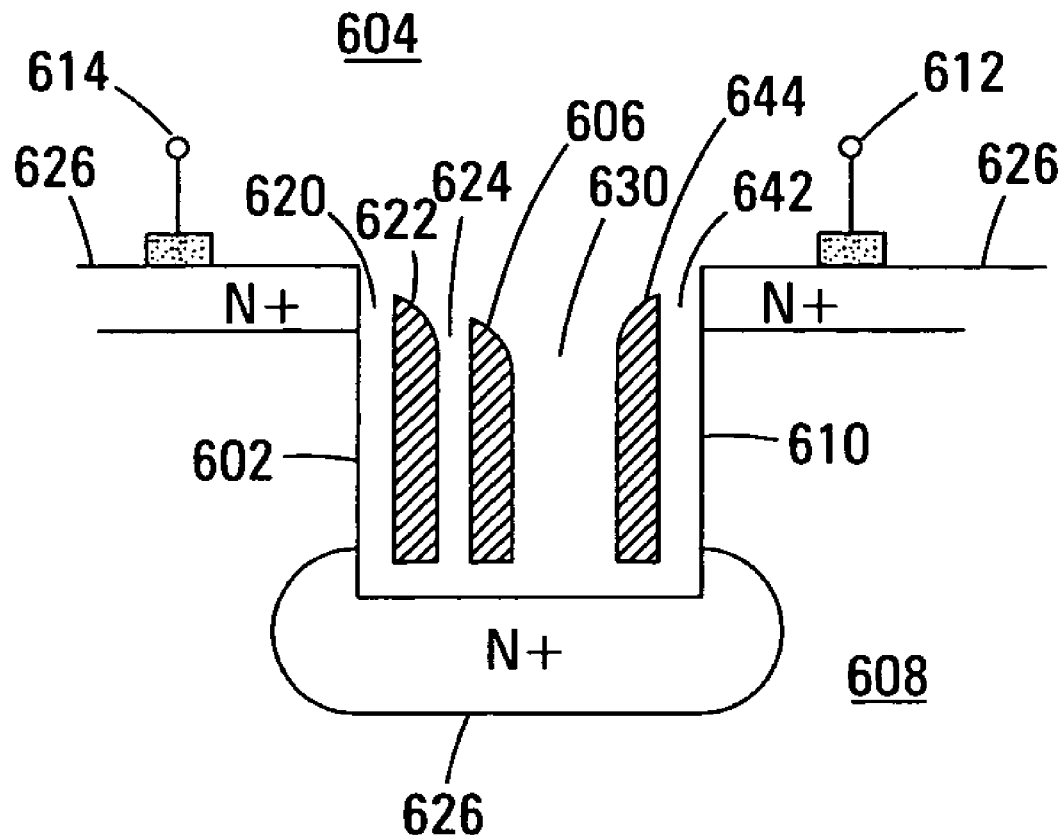

FIGS. 6A-6C detail vertical NROM memory cells and select gates for a NOR architecture NROM memory array in accordance with embodiments of the present invention. FIG. 6A details a side view of a simplified vertical NOR architecture memory cell structure 604, a side view of a vertical NOR memory array 600 is detailed in FIG. 6B. FIG. 6C details an equivalent circuit schematic 620 of the vertical NOR architecture NROM memory array 600, showing NROM memory cells 602 and substrate connection 622. It is noted that the NOR architecture NROM memory array 600 can be utilized in both EEPROM or Flash memories arrays and devices. As can be seen from FIGS. 6A and 6B, in a single vertical NOR architecture memory cell structure 604, two vertically formed transistors occupy the area that a single planar NROM transistor would occupy (an area of 4F squared when viewed from above, each transistor having an area of 2F squared). Where "F" is the minimum resolvable photolithographic dimension in the particular process technology.

In FIG. 6A, a vertically formed NROM memory cell 602 and select gate 610 are coupled together in series in a vertical NOR architecture memory cell structure 604. In creating the vertical NOR architecture memory cell structure 604 a trench 630 is formed in a substrate 608. The vertical NROM memory cell 602 and select gate 610 are then formed on the sidewalls of the trench 630. The vertical NROM memory cell 602 has a gate-insulator stack made of an insulator 620 formed on the surface of the sidewall, a trapping layer 622 (typically of nitride) formed on the insulator 620, an intergate insulator 624 formed over the NROM 622, and a control gate 606 (typically formed in a control gate line, also known as a word line) formed over the intergate insulator 624. In one embodiment, the substrate trench 630 is formed by patterning a masking material that is layered over the substrate 608 and anisotropically etching the trenches 630. The gate-insulator stack of the NROM memory cell 602 is formed in one embodiment by successive layering of each of the materials of the gate insulator stack over the trench 630, followed by a mask and directional etch of the deposit of each layer to leave only the material deposited on the sidewall of the trench 630. In another embodiment, differing layers of the gate-insulator stack are formed and then masked and directionally etched in a single step.

The vertical select gate 610 has a gate-insulator stack made of an insulator 642 formed on the opposite sidewall of the trench 630 with a control gate 644 formed over the insulator 642. The gate-insulator stack of the select gate 610 is formed by successive layering of each of the materials of the gate insulator stack over the trench 630, as with the vertical NROM memory cell 602, but skips the depositing of the insulator 620 and trapping layer 622 layers. In one embodiment of the present invention the insulator 620 and the trapping layer 622 of the NROM memory cell 602 are formed and then the intergate insulator 624/control gate 606 of the NROM memory cell 602 and the insulator 642/control gate 644 of the select gate 610 are formed consecutively.

N+ doped regions 626 are formed at the raised areas at the top and at the bottom of the trenches 630 to form the source/drain regions for the vertical NROM memory cell/gate-insulator stack 602 and select gate 610. The N+ regions also couple the memory cell 602 and select gate 610 together to form the vertical NOR memory structure 604 and additionally couple the vertical NOR architecture memory cell structure 604 to the bit lines 612. It is noted that the N+ source/drain regions 626 may be formed before or after the formation of the NROM memory cell 602 and select gate 610 gate-insulator stacks.

In FIG. 6B, a vertical NOR architecture NROM memory array 600 is formed from a series of vertical NOR architecture memory cell structures 604. Each vertical NOR architecture memory cell structures 604 having a vertically formed NROM memory cell 602 and a coupled select gate 610, wherein the drain of the select gate is coupled to a first bit/data line 612 and a source/drain of the NROM 602 is coupled to a second bit/data line 612.

In creating the vertical NOR architecture NROM memory array 600 a series of substrate pillars 628 are formed in a substrate 608 with trenches 630 located between them. The vertical NROM memory cells 602 and select gates 610 are then formed on the sidewalls of the pillars 628 within the trenches 630 to form the vertical NOR architecture memory cell structures 604. The vertical NROM memory cells 602 and select gates 610 are formed in an alternating pattern (NROM-select gate, select gate-NROM, NROM-select gate, etc.) such that each pillar 628 has either select gates 610 or NROM memory cells formed on its sidewalls.

N+ doped regions 626 are formed at the top of the pillars 628 and at the bottom of the trenches 630 to form the source and drain regions. The N+ regions at the bottom of the trenches 630 couple the memory cell 602 and select gate 610 of each vertical NOR architecture memory cell structure 604 together. The N+ regions at the tops of the pillars 628 couple the drain of the select gate 610 and the source of the NROM memory cell 602 of each vertical NOR architecture memory cell structure 604 to the bit lines 612 respectively. It is again noted that the N+ source/drain regions 626 may be formed before or after the formation of the NROM memory cell 602 and select gate 610 gate-insulator stacks.

It is also noted that isolation regions, typically formed of an oxide insulator, can be used between adjacent rows of vertical NOR architecture memory cell structures 604 to isolate each row from its neighbors. These isolation regions can be extended into the substrate 608 to allow the formation of P-wells, where each P-well contains a single row of vertical NOR architecture memory cell structures 604 that can be biased in isolation from the other rows of the array 600. It is also noted that the control gate/word address lines 606 and select lines 640 can cross these isolation regions so that each control gate/word address line 606 and select line 640 controls the operation of multiple NROM memory cells 602 and select gates 610, respectively, across multiple rows of vertical NOR architecture memory cell structures 604.

As stated above, FIG. 6C details an equivalent circuit schematic 620 of the vertical NOR architecture NROM memory array 600, showing NROM memory cells 602 and substrate connection 622. The vertical NROM memory cells 602 and select gates 610 are formed in an alternating pattern (NROM-select gate, select gate-NROM, NROM-select gate, etc.) so that the drain of the select gate 610 and the source/drain of the NROM memory cell 602 of adjacent vertical NOR architecture memory cell structures 604 are both coupled to a single bit line 612. It is noted that non-alternating patterns are also possible. It is noted that other array patterns of vertical NROM memory cells 602, select gates 610, and vertical NROM memory cell structures 604 are possible and will be apparent to those skilled in the art with the benefit of the present disclosure.

In the vertical NOR architecture NROM memory array 600 of FIGS. 6A-6C, the channel length of each NROM memory cell 602 and select gate 610 in a vertical NOR architecture memory cell structure 604 is determined by the depth of the trenches 630 and not by the minimum feature size. Due to the vertical form of the vertical NOR architecture NROM memory array 600 and vertical NOR architecture memory cell structures 604 of embodiments of the present invention, a NOR architecture NROM memory array can be produced that contain a vertical NROM memory cell 602 that does not suffer from charge separation issues and a coupled select gate 610 in the space that would be utilized by a single conventional planar NROM memory cell.

The addition of a select gate 610 coupled between the bit line 612 and a source/drain of each NROM memory cell 602 allows for the NROM memory cell 602 to be isolated from the bit lines 612 and thus has advantages in both programming and erasing the NROM memory cells 602 of the vertical NOR architecture NROM memory array 600. In erasing, the coupled select gate 610 allows for avoidance of overerasure issues with NROM memory cells 602 by isolating each memory cell 602 behind a select gate 610 so that, even if an NROM memory cell 602 is overerased into depletion mode, it will not corrupt the reading of other memory cells 602 on its coupled bit lines 612 by flowing current. As the possibility of corruption of data reads due to overerasure is mitigated, this allows for the NOR architecture NROM memory array 600 to speed up its erasure processes by using larger erase pulses (in time or voltage) or even utilizing only a single erase pulse. In addition, by allowing the increase of erasure pulse time and voltage, the number of erasure verifications required are reduced or even eliminated. The coupled select gate 610 also allows for the isolated erasure of one or more NROM memory cells 602 allowing erasure of individual NROM memory cells 602, one or more selected data words, data segments, or erase blocks.

In programming, the coupled select gate 610 allows for mitigation of programming disturb of NROM memory cells 602 in the array 600 by the select gate 610 isolating or buffering the memory cells 602 from the bit lines 612. This allows for longer and higher voltage programming pulses to be used without increasing the possibility of disturb issues.

Figure 7A:
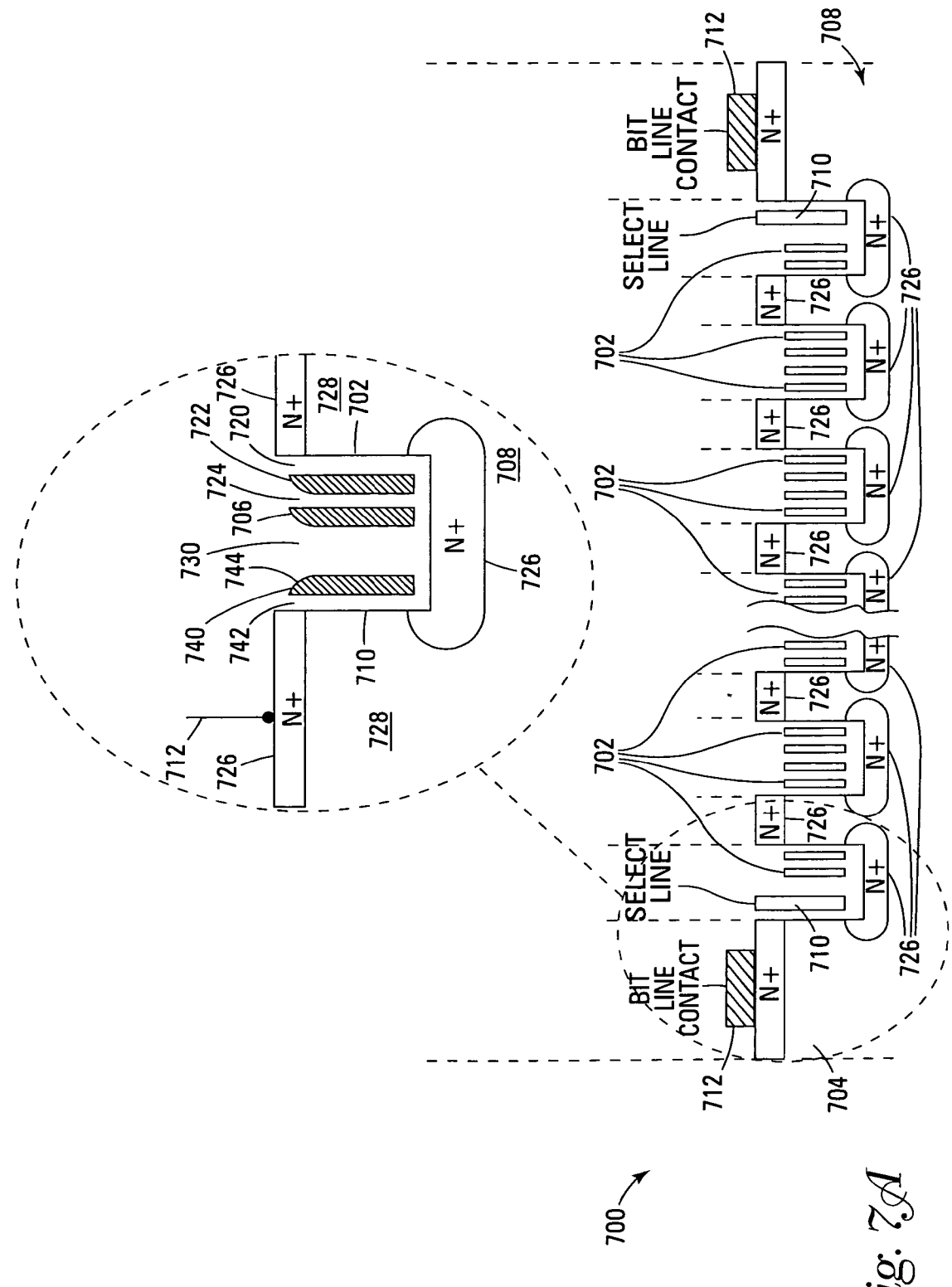
FIGS. 7A-7D detail vertical NAND NROM memory array and cells in accordance with embodiments of the present invention.
Figure 7B:
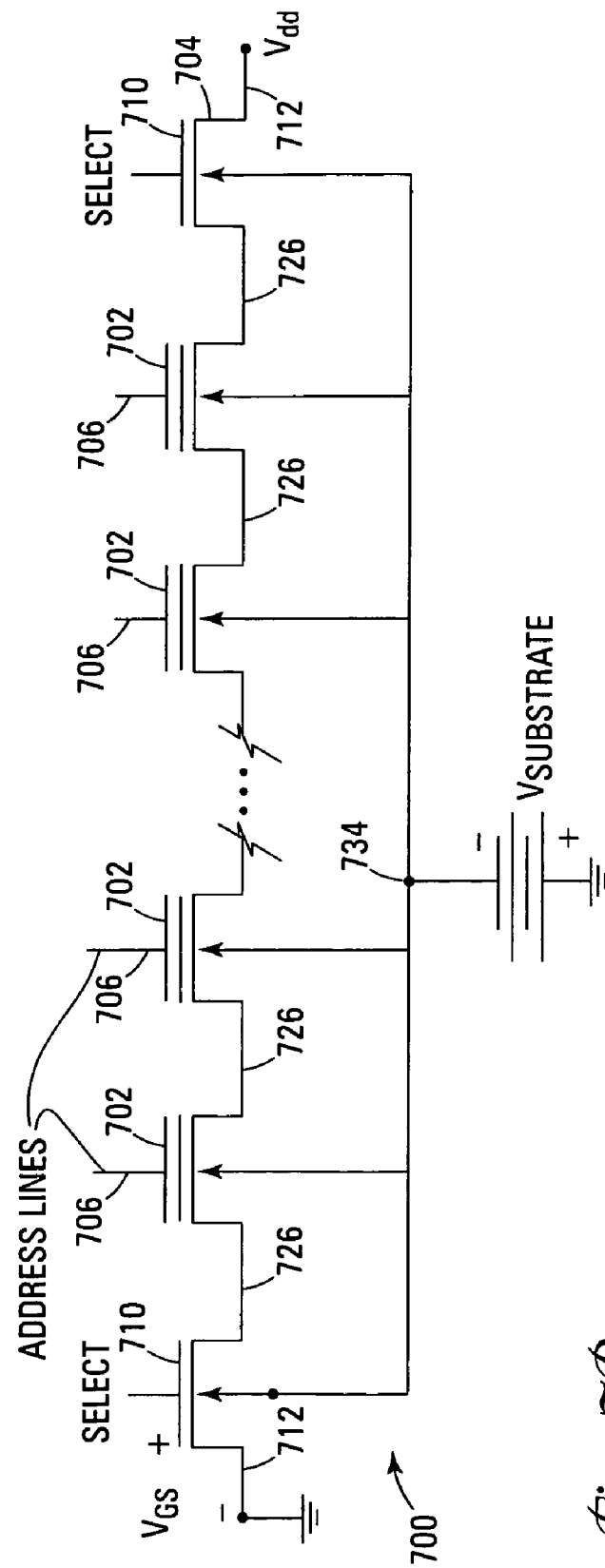
Figure 7C:
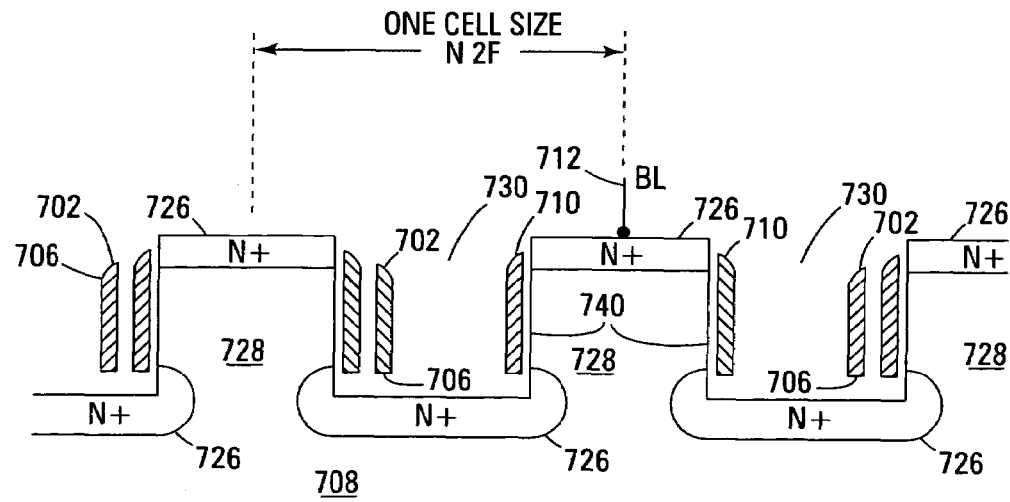

FIGS. 7A-7D detail vertical NROM cells, vertical select gates, and NAND architecture NROM memory strings in accordance with embodiments of the present invention. FIG. 7A details a side view of a simplified vertical NAND architecture NROM memory string 704 with vertical select gates 710. FIG. 7B details an equivalent circuit schematic 720 of the vertical NAND architecture NROM memory string 704, showing NROM memory cells 702 and substrate connection 734. FIG. 7C details a side view of a simplified vertical NAND architecture NROM memory array 700 and FIG. 7D details an equivalent circuit schematic of one embodiment of the present invention. Again, as can be seen from FIGS. 7A and 7C, in a vertical NAND architecture memory string 704, two vertically formed transistors occupy the area that each planar transistor would occupy (an area of 4F squared when viewed from above, each transistor having an area of 2F squared). Where "F" is the minimum resolvable photolithographic dimension in the particular process technology. Since each transistor can store a single bit of data the data storage density is one bit for each 2F squared unit area. Thus, for example, if F=0.1 micron then the storage density is 0.5 Giga bit per square centimeter.

In FIG. 7A, a series of vertically formed NROM memory cells 702 are coupled together in a series NROM NAND string 704 (typically of 8, 16, 32, or more cells). In the vertical NAND NROM memory array string 704 of FIGS. 7A-7D, a series of substrate pillars 728 are formed in a substrate 708 with trenches 730 located between them. The vertical NROM memory cells 702 are then formed on the sidewalls of the pillars 728 within the trenches 730. Each vertical NROM memory cell 702 is formed on the sidewalls of the substrate pillars 728 (for two NROM memory cells 702 per trench 730) and has a gate-insulator stack made of an insulator 720 formed on the surface of the sidewall, a trapping layer 722 (typically of polysilicon) formed on the insulator 720, an intergate insulator 724 formed over the trapping layer 722, and a control gate 706 (typically formed in a control gate line, also known as a word line) formed over the intergate insulator 724.

In one embodiment the substrate pillars 728 and trenches 730 are formed by patterning a masking material that is layered over the substrate 708 and anisotropically etching the trenches 730. The gate-insulator stack of each NROM memory cell 702 are formed in one embodiment by successive layering of each of the materials of the gate insulator stack over the pillars 728 and trenches 730, followed by a mask and directional etch of the deposit of each layer to leave only the material deposited on the sidewall of the pillars 728. In another embodiment, differing layers of the gate-insulator stack are formed and then masked and directionally etched in a single step.

N+ doped regions 726 are formed at the top of the substrate pillars 728 and at the bottom of the trenches 730 between each vertical NROM memory cell/gate-insulator stack 702 to form the source and drain regions of the adjacent NROM memory cells 702 and couple the memory cells 702 together to form the vertical NAND architecture memory string 704. It is noted that the N+ source/drain regions 726 may be formed before or after the formation of the NROM memory cells/gate-insulator stack 702.

Select gates 710, that are coupled to gate select lines, are formed at either end of the NAND NROM memory string 704 and selectively couple opposite ends of the NAND NROM memory string 704 to a bit line contacts 712. The vertical select gates 710 have a gate-insulator stack made of an insulator 742 formed on a sidewall with a control gate 744 formed over the insulator 742. The gate-insulator stack of the select gates 710 are formed by successive layering of each of the materials of the gate insulator stack over the pillars 728 and trenches 730, as with the vertical NROM memory cell 702, but skips the depositing of the insulator 720 and trapping layer 722 layers. The N+ regions 726 also couple the first and last memory cell 702 of the vertical NAND architecture NROM string 704 to the select gates 710 and additionally couple the vertical NAND architecture NROM string 704 to the bit lines 712.

As stated above, FIG. 7B details an equivalent circuit schematic of the vertical NAND architecture NROM memory array 700, showing the vertical NROM memory cells 702, select gates 710, bit line 712 connections, and substrate connection 734, in accordance with embodiments of the present invention. As can be seen, the schematic provides the same equivalent circuit as that of a conventional planar NAND architecture NROM memory string.

In FIG. 7C, a section of vertical NAND architecture NROM memory array 700 of one embodiment of the present invention is formed from a series of vertical NAND architecture NROM memory cell strings 704. In FIG. 7C, each pair of adjacent vertical NAND architecture NROM memory cell strings 704 in the vertical NAND architecture NROM memory array 700 are coupled through vertical select gates 710 to a common bit line 712 by a N+ doped region 726 formed at the top of a pillar 728.

It is also noted that isolation regions, typically formed of an oxide insulator, can be used between vertical NAND architecture NROM memory cell strings 704 to isolate each string 704 from its neighbors. These isolation regions can be extended into the substrate 708 to allow the formation of P-wells, where each P-well contains a single vertical NAND architecture NROM memory cell string 704 that can be biased in isolation from the other strings or rows of the array 700. It is also noted that the control gate/word address lines 706 and select lines 740 can cross these isolation regions so that each control gate/word address line 706 and select line 740 controls the operation of NROM memory cells 702 and select gates 710 respectively across multiple rows of vertical NAND architecture NROM memory cell strings 704.

Figure 7D:
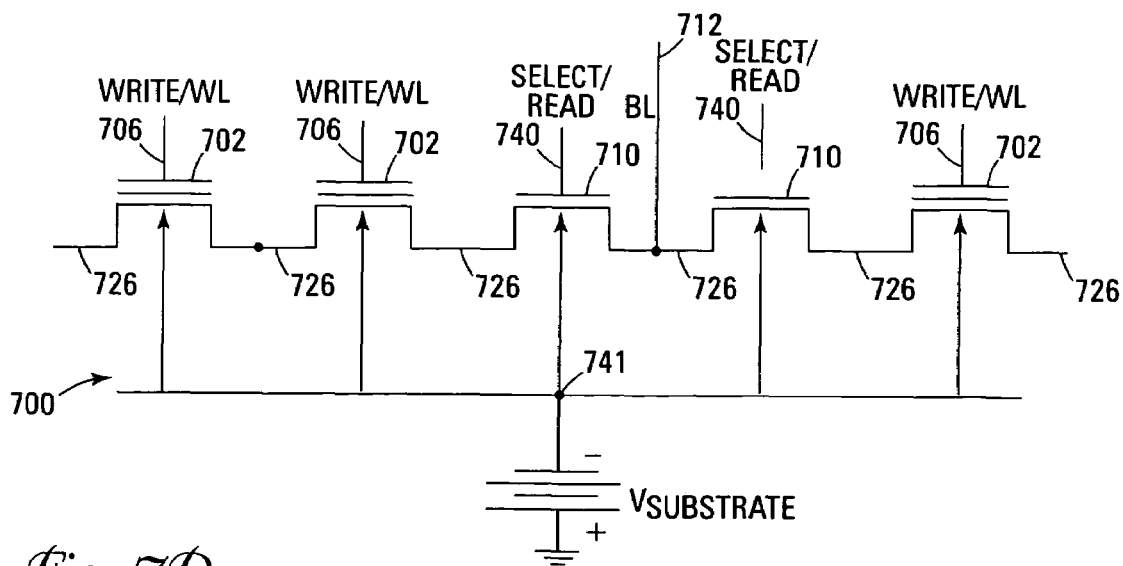

As stated above, FIG. 7D details an equivalent circuit schematic of the vertical NAND architecture NROM memory array of FIG. 7C, showing NROM memory cells 702 and adjacent sting 704 connection.

In the vertical NAND architecture NROM memory array 700 of FIGS. 7A-7D, the channel length of each NROM memory cell 702 and select gate 710 in a vertical NAND architecture memory string 704 is determined by the depth of the pillars 728 and trenches 730 and not by the minimum feature size. Due to the vertical form of the NAND architecture NROM memory array 700 and NAND architecture memory strings 704 of embodiments of the present invention, a vertical NAND architecture NROM memory array string 704 and select gates 710 can be produced that typically has twice the density for a given string horizontal run length than a corresponding planar NAND architecture NROM memory array string.

The addition of select gates 710 coupled between the bit lines 712 and the NROM memory cells 702 of the vertical NAND architecture memory string 704 allows for the NROM memory cells 702 of the vertical NAND architecture memory string 704 to be isolated from one or both of the bit lines 712 and thus has advantages in both programming and erasing the vertical NAND architecture memory string 704. In erasing, the coupled select gates 710 allows for avoidance of overerasure issues with NROM memory cells 702 by isolating each vertical NAND architecture memory string 704 behind one or more select gates 710 so that even if the NROM memory cells 702 of the vertical NAND architecture memory string 704 are overerased into depletion mode operation they will not corrupt the reading of other memory cells 702 on other vertical NAND architecture memory strings 704 that are coupled to the same bit line 712. As the possibility of corruption of data reads due to overerasure is mitigated, this allows for the vertical NAND architecture NROM memory array 700 to speed up erasure processes by using larger erase pulses or even a single erase pulse and by reducing or eliminating erasure verification. The coupled select gates 710 also allow for the isolated erasure of one or more NROM memory cells 702 allowing erasure of individual NROM memory cells 702, individual vertical NAND architecture memory strings 704, one or more selected data words, or erase blocks. In programming, the coupled select gates 710 allow for mitigation of programming disturb of NROM memory cells 702 in the array 700 by the select gates 710 isolating the memory cells 702 of the vertical NAND architecture memory strings 704 from the bit lines 712. This allows for longer and higher voltage programming pulses to be used without an increased issue with of disturb problems.

Figure 8A:
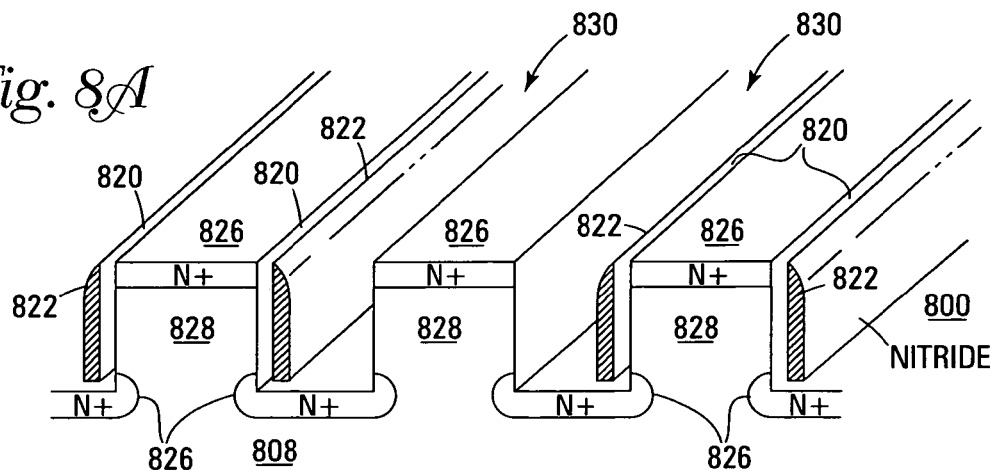
FIGS. 8A-8C detail formation of a vertical NAND architecture NROM memory array having NROM memory cells and select gates in accordance with embodiments of the present invention.
Figure 8B:
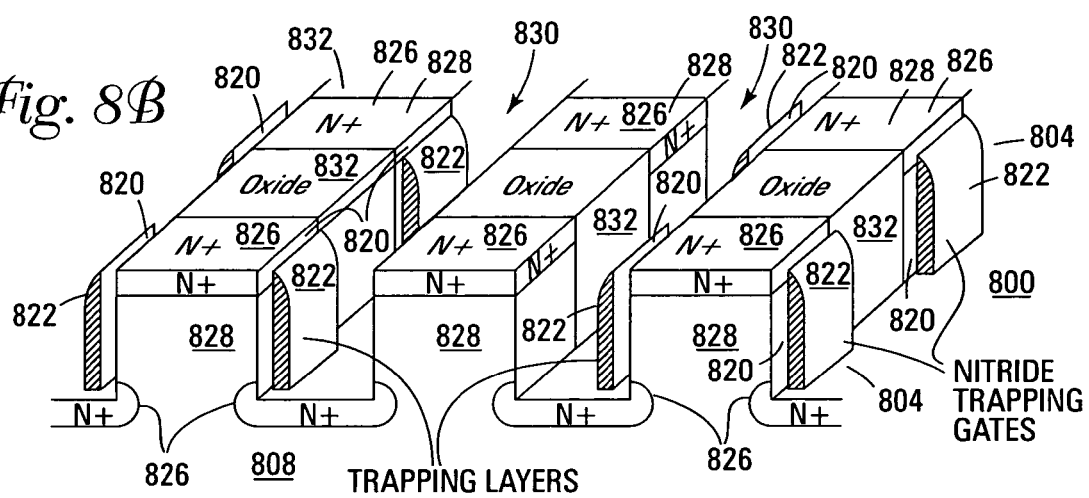
Figure 8C:
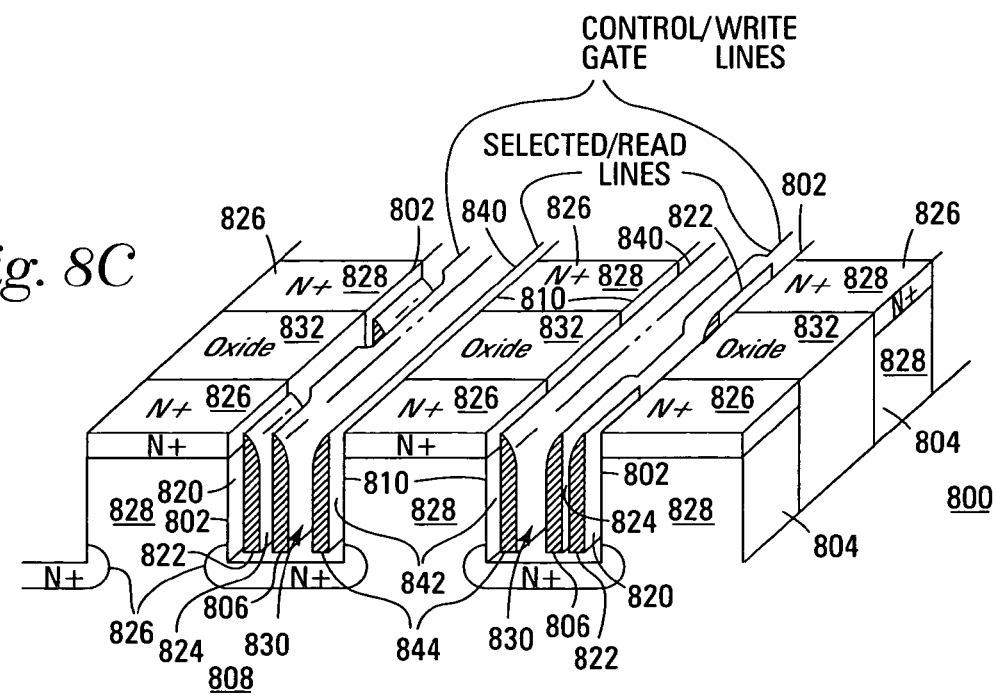

FIGS. 8A-8C detail three dimensional views of vertical NROM cells 802 and vertical select gates 810 of a vertical NAND NROM memory array 800 in accordance with embodiments of the present invention at several mid-fabrication stages. It is noted that a formation process that is similar to the NAND process may be utilized for formation of a vertical NOR NROM memory array 600 with the exception of placement and number of the select gates 810 and bit line and source line contacts. As stated above, in creating the vertical NAND NROM memory array 800, a series of substrate pillars 828 are formed in a substrate 808 with trenches 830 located between them. The vertical NROM memory cells 802 and select gates 810 are then formed on the sidewalls of the pillars 828 within the trenches 830. Between successive rows of substrate pillars 828, isolation regions 832 have been formed on the faces of the pillars 828 that are not utilized to form NROM memory cells 802 or select gates 810 to isolate each row of vertical NAND NROM memory strings 804 from the neighboring rows. These isolation regions 832 are typically formed of an oxide insulator.

As stated above, in creating each NROM memory cell gate-insulator stack 802, an insulator 820 is formed on the surface of the sidewall, a trapping layer 822 is formed on the insulator 820, an intergate insulator 824 is formed over the trapping layer 822, and a control gate 806 is formed over the intergate insulator 824. In creating each select gate gate-insulator stack 810, an insulator 842 is formed on the surface of the sidewall, and a control gate 844 is formed over the insulator 842.

In FIG. 8A, the trenches 830 have been already formed by masking and anisotropically/directionally etching the trenches 830 in the substrate 808. N+ doped regions 826 have been formed at the top of the unformed substrate pillars 828 and at the bottom of the trenches 830 to form the source/drain regions of the NROM memory cells 802. The gate-insulator stack of each NROM memory cell 802 have been partially formed on the sidewalls of the trenches 830. In each trench 830, with the exception of the pillar 828 on which the select gates 810 are to be formed, are formed the insulator 820, the trapping layer 822, and the intergate insulator 824, by successive depositing, masking, and directional etching of layers of material.

In FIG. 8B, the pillars 828 are formed and the space between each pillar in successive rows of NAND architecture NROM memory strings 804 are filled with an oxide to form isolation regions 832. In forming the pillars 828, the rows of NAND architecture NROM memory strings 804 are masked and directionally etched. This masking and etching process also divides the NROM layer into individual trapping layers 822.

In FIG. 8C, the control gates/word lines 806 and select gates 810/select lines 840 are formed. In forming the control gates/word lines 806 and select gates 810/select lines 840, successive layers of insulator and polysilicon which will form the control gates/word lines 806 and select gates 810/select lines 840 is deposited over the pillars 828, trenches 830, and partially formed gate-insulator stacks of the NROM memory cells 802 of the memory array 800. A layer of masking material is then formed over the polysilicon layer and patterned. The excess masking material is removed and the memory array 800 is anisotropically/directionally etched to remove the undesired portions of the deposited polysilicon and form the control gates/word lines 806 and select gates 810/select lines 840 on the sidewalls of the pillars 828 and trenches 830.

It is noted that the isolation regions 832 between the vertical NAND architecture NROM strings 804 can be extended into the substrate 808 to allow the formation of P-wells, where each P-well contains a single NAND string 804 and can be biased in isolation from the other strings 804 of the array 800. It is also noted that the control gates/word lines 806 and select gates 810/select lines 840 cross these isolation regions 832 so that each control gate/word address line 806 controls the operation of NROM memory cells 802 and each select line 840 the operation of select gates 810 across multiple NAND memory strings 804.

In FIGS. 8A-8C, the substrate 808 of the vertical NAND architecture NROM memory array 800 is P-doped. A substrate connection can be utilized that can allow for biasing of the P-doped substrate 808. It is noted that other forms of substrate doping, substrate biasing, and substrate types and regions (including, but not limited to silicon-on-sapphire (SOS) technology, silicon-on-insulator (SOI) technology, thin film transistor (TFT) technology, doped and undoped semiconductors, epitaxial layers of silicon supported by a base semiconductor) in embodiments of the present invention are possible and should be apparent to those skilled in the art with the benefit of the present invention.

It is noted that the NROM memory cells of embodiments of the present invention can be formed from multiple conventional materials. For the gate-insulator stack (gate insulator-trapping layer-top insulator) these materials may include, but are not limited to, oxide-nitride-oxide (ONO), oxide-nitride-aluminum oxide, oxide-aluminum oxide-oxide, oxide-silicon oxycarbide-oxide, composite layers of a silicon oxide-an oxide of Ti, Ta, Hf, Zr, or La, and a silicon oxide, and composite layers of an oxide-a non-stoichiometric oxide of Si, N, Al, Ti, Ta, Hf, Zr, and La, and an oxide. Additional trapping layer materials for NROM memory cell embodiments of the present invention, may also include, but are not limited to, wet oxides not annealed, silicon rich oxides, silicon rich aluminum oxide, silicon oxycarbide, silicon oxide with silicon carbide nanoparticles, and non-stoichiometric oxides of Si, N, Al, Ti, Ta, Hf, Zr, and La.

As noted above the programming of the NROM memory cells of the vertical NAND and NOR NROM architecture memory structures, strings, and arrays of embodiments of the present invention can be accomplished by conventional tunnel injection of electrons by having a positive gate voltage with respect to the substrate or P-well. In another embodiment of the present invention, programming is accomplished by channel hot electron injection (HEI). Erasure of the NROM memory cells of embodiments of the present invention can accomplished by conventional tunneling or negative voltages applied to the control gate voltages with respect to the substrate or P-well. With the above listed programming and erasure techniques, the NROM memory cells of embodiments of the present invention can be utilized for two-bit storage as a conventional planar NROM memory cells would be, storing charge in the trapping layer near each source/drain, allowing one bit to be read/programmed when biased in the forward direction and the other to be read/programmed when biased in the reverse direction.

In alternative embodiments of the present invention, substrate enhanced hot electron injection (SEHE) can be utilized for NROM memory cell programming and/or substrate enhanced band to band tunneling induced hot hole injection (SEBBHH) for NROM memory cell erasure. However, while the required voltages for these operations may be lower, they may only be suitable for single bit storage operation mode.

Figure 9:
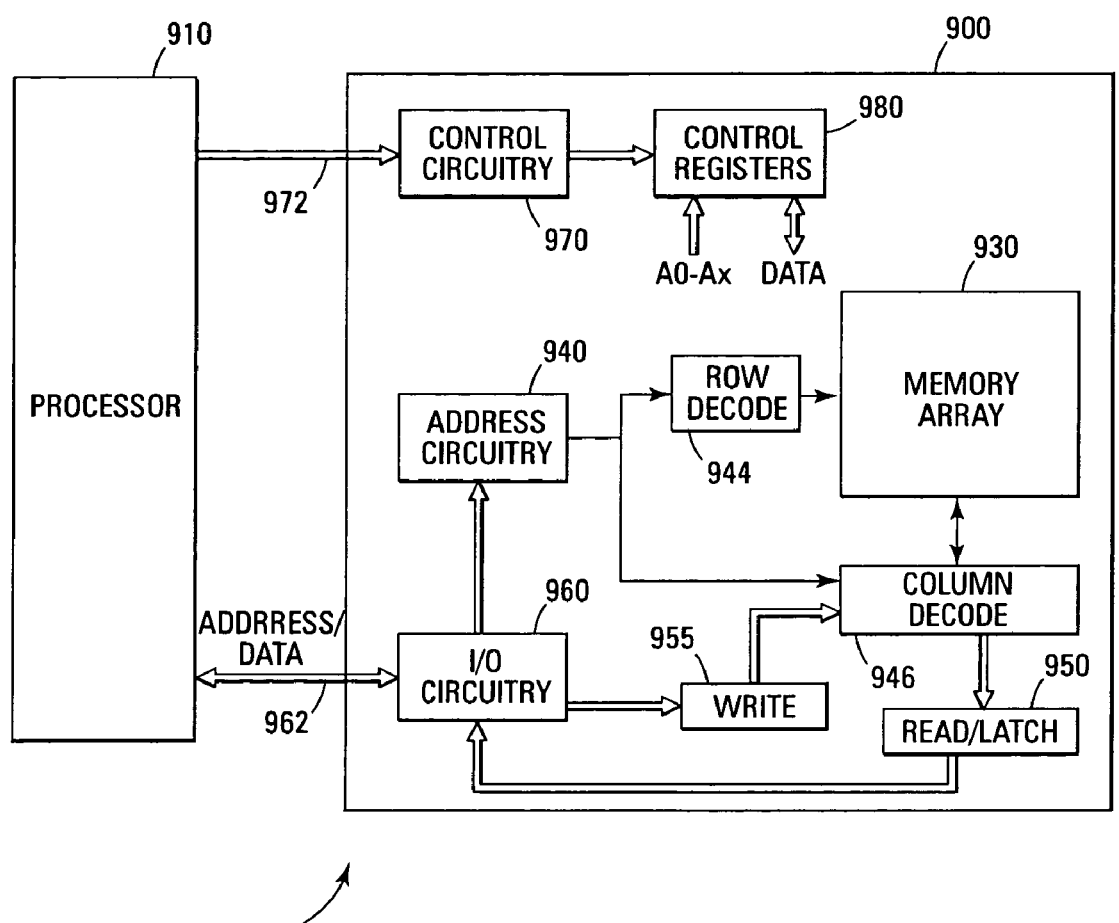
FIG. 9 details a block diagram of an electronic system in accordance with embodiments of the present invention.

FIG. 9 illustrates a functional block diagram of a memory device 900 that can incorporate the vertical NAND architecture NROM memory array 700 or vertical NOR architecture NROM memory cell array 600 of the present invention. The memory device 900 is coupled to a processor 910. The processor 910 may be a microprocessor or some other type of controlling circuitry. The memory device 900 and the processor 910 form part of an electronic system 920. The memory device 900 has been simplified to focus on features of the memory that are helpful in understanding the present invention.

The memory device includes an array of vertical NROM memory cells and select gates 930. In one embodiment, the memory cells are vertical NROM memory cells and the memory array 930 are arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 940 is provided to latch address signals provided on address/data bus 962. Address signals are received and decoded by a row decoder 944 and a column decoder 946 to access the memory array 930. It will be appreciated by those skilled in the art, with the benefit of the present description, that the size of address input on the address/data bus 962 depends on the density and architecture of the memory array 930. That is, the size of the input address increases with both increased memory cell counts and increased bank and block counts. It is noted that other address input manners, such as through a separate address bus, are also known and will be understood by those skilled in the art with the benefit of the present description.

The memory device 900 reads data in the memory array 930 by sensing voltage or current changes in the memory array columns using sense/buffer circuitry 950. The sense/buffer circuitry, in one embodiment, is coupled to read and latch a row of data from the memory array 930. Data input and output buffer circuitry 960 is included for bi-directional data communication over a plurality of data connections in the address/data bus 962 with the processor/controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller.

Since the vertical NROM memory cells of the present invention use a CMOS compatible process, the memory device 900 of FIG. 9 may be an embedded device with a CMOS processor.

The memory device illustrated in FIG. 9 has been simplified to facilitate a basic understanding of the features of the memory. A more detailed understanding of internal circuitry and functions of memories are known to those skilled in the art.

It is also noted that other vertical NAND and NOR architecture NROM memory strings, segments, arrays, and memory devices in accordance with embodiments of the present invention are possible and should be apparent to those skilled in the art with benefit of the present disclosure.

CONCLUSION

NROM EEPROM memory devices and arrays have been described that facilitate the use of vertical NROM memory cells and select gates in NOR or NAND high density memory architectures. Memory embodiments of the present invention utilize vertical select gates and NROM memory cells to form NOR and NAND NROM architecture memory cell strings, segments, and arrays. These NROM memory cell architectures allow for improved high density memory devices or arrays with integral select gates that can take advantage of the feature sizes semiconductor fabrication processes are generally capable of and yet do not suffer from charge separation issues in typical multi-bit NROM cells. The memory cell architectures also allow for mitigation of disturb and overerasure issues by placing the NROM memory cells behind select gates that isolate the memory cells from their associated bit/data lines and/or source lines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A NAND architecture NROM memory cell string, comprising:
    a substrate, comprising two or more raised areas, defining trenches therebetween;
    a plurality of NROM memory cells, wherein the NROM memory cells are formed vertically on the sidewalls of the trenches;
    wherein the plurality of NROM memory cells are coupled in a serial string by source/drain regions formed at the top of the two or more raised areas and at the bottom of the one or more trenches, wherein the source/drain regions formed at the bottom of the one or more trenches have first and second edges that extend beyond opposite sidewalls of their respective trenches; and
    wherein a first NROM memory cell of the string is coupled to a first select gate.

2. The NROM memory cell string of claim 1, wherein a last NROM memory cell of the string is coupled to a second select gate.

3. The NROM memory cell string of claim 1, wherein the raised areas are pillars.

4. The NROM memory cell string of claim 2, further comprising:
    a plurality of word lines, wherein each word line is coupled to a control gate of an NROM memory cell of the string;
    one or more select lines, wherein each select line is coupled to a control gate of a select gate of the string;
    a first bitline, wherein the first bitline is coupled to a source/drain of the first select gate; and
    a second bitline, wherein the second bitline is coupled to a source/drain of the second select gate of the string.

5. The NROM memory cell string of claim 2, further comprising:
    a plurality of word lines, wherein each word line is coupled to a control gate of an NROM memory cell of the string;
    one or more select lines, wherein each select line is coupled to a control gate of a select gate of the string;
    a first bitline, wherein the first bitline is coupled to a drain of the first select gate; and
    a source line, wherein the source line is coupled to a source of the second select gate of the string.

6. The NROM memory cell string of claim 1, wherein the NROM memory cell string is formed on a P-well isolation region.

7. A memory array, comprising:
    a substrate, comprising a plurality of pillars and associated intervening trenches;
    a plurality of NROM memory cells, wherein the NROM memory cells are formed vertically on the sidewalls of the plurality of pillars and trenches;
    wherein the plurality of NROM memory cells are coupled into a plurality of NAND architecture memory strings by source/drain regions formed at the top of the plurality of pillars and at the bottom of the associated trenches, wherein the source/drain regions formed at the bottom of the associated intervening trenches have first and second edges that extend beyond opposite sidewalls of their respective trenches; and
    wherein a first NROM memory cell of each NAND architecture memory string is coupled to a first vertical select gate and a last NROM memory cell of each NAND architecture memory string is coupled to a second vertical select gate.

8. The memory array of claim 7, further comprising:
    a plurality of word lines, wherein each word line is coupled to one or more control gates of one or more NROM memory cells, where each of the one or more NROM memory cells is from a differing memory string;
    a plurality of select lines, wherein each select line is coupled to one or more select gates;
    at least one first bitline, wherein the at least one first bitline is coupled to a source/drain of the first select gate of each memory string; and
    at least one second bitline, wherein the at least one second bitline is coupled to a source/drain of the second select gate of each memory string.

9. The memory array of claim 7, further comprising:
    a plurality of word lines, wherein each word line is coupled to one or more control gates of one or more NROM memory cells, where each of the one or more NROM memory cells is from a differing memory string;
    a plurality of select lines, wherein each select line is coupled to one or more select gates;
    at least one bitline, wherein the at least one bitline is coupled to a drain of the first select gate of each memory string; and
    at least one source line, wherein the at least one source line is coupled to a source of the second select gate of each memory string.

10. The memory array of claim 7, wherein an isolation region is formed between adjacent memory strings.

11. The memory array of claim 10, wherein each memory string is formed on a P-well isolation region.

12. A memory device, comprising:
    a memory array formed on a substrate having a plurality of pillars and associated intervening trenches;
    a plurality of NROM memory cells, wherein the NROM memory cells are formed vertically on the sidewalls of the plurality of pillars and trenches;
    wherein the plurality of NROM memory cells are coupled into a plurality of NAND architecture memory strings by source/drain regions formed at the top of the plurality of pillars and at the bottom of the associated trenches, wherein the source/drain regions formed at the bottom of the associated intervening trenches have first and second edges that extend beyond opposite sidewalls of their respective trenches; and
    wherein a first NROM memory cell of each string is coupled to a first select gate and a last NROM memory cell of each string is coupled to a second select gate.

13. The memory device of claim 12, further comprising:
a plurality of word lines, wherein each word line is coupled to one or more control gates of one or more NROM memory cells, where each of the one or more NROM memory cells is from a differing string;
a plurality of select lines, wherein each select line is coupled to one or more select gates;
at least one first bit/data line, wherein the at least one first bit/data line is coupled to a source/drain of the first select gate of each string; and
at least one second bit/data line, wherein the at least one second bit/data line is coupled to a source/drain of the second select gate of each string.

14. The memory device of claim 12, further comprising:
a plurality of word lines, wherein each word line is coupled to one or more control gates of one or more NROM memory cells, where each of the one or more NROM memory cells is from a differing string;
a plurality of select lines, wherein each select line is coupled to one or more select gates;
at least one bit/data line, wherein the at least one bit/data line is coupled to a drain of the first select gate of each string; and
at least one source line, wherein the at least one source line is coupled to a source of the second select gate of each string.

15. The memory device of claim 12, wherein an isolation region is formed between adjacent memory strings.

16. The memory device of claim 12, wherein the plurality of memory cell strings are formed on one or more P-well isolation regions.

17. A memory device comprising:
a NAND architecture memory array formed on a substrate having a plurality of pillars and associated intervening trenches;
a plurality of NROM memory cells, wherein the NROM memory cells are formed vertically on the sidewalls of the plurality of pillars and trenches;
wherein the plurality of NROM memory cells are coupled into a plurality of NAND architecture memory strings by source/drain regions formed at the top of the plurality of pillars and at the bottom of the associated trenches, wherein the source/drain regions formed at the bottom of the associated intervening trenches have first and second edges that extend beyond opposite sidewalls of their respective trenches;
wherein a first NROM memory cell of each string is coupled to a first vertical select gate and a last NROM memory cell of each string is coupled to a second vertical select gate;
a control circuit;
a row decoder;
a plurality of word lines coupled to the row decoder, wherein each word line is coupled to one or more control gates of one or more NROM memory cells, where each of the one or more NROM memory cells is from a differing string;
a plurality of select lines, wherein each select line is coupled to one or more select gates;
at least one first bitline, wherein the at least one first bitline is coupled to a source/drain of the first select gate of each string; and
at least one second bitline, wherein the at least one second bitline is coupled to a source/drain of the second select gate of each string.

18. A system, comprising:
a processor coupled to at least one memory device, wherein the at least one memory device comprises,
a memory array formed on a substrate having a plurality of pillars and associated intervening trenches,
a plurality of NROM memory cells, wherein the NROM memory cells are formed vertically on the sidewalls of the plurality of pillars and trenches,
wherein the plurality of NROM cells are coupled into a plurality of NAND architecture memory strings by source/drain regions formed at the top of the plurality of pillars and at the bottom of the associated trenches, wherein the source/drain regions formed at the bottom of the associated intervening trenches have first and second edges that extend beyond opposite sidewalls of their respective trenches: and
wherein a first NROM memory cell of each string is coupled to a first vertical select gate and a last NROM memory cell of each string is coupled to a second vertical select gate.

19. A memory device comprising:
a memory array formed on a substrate having a plurality of NROM memory cells arranged in rows and columns and coupled into a plurality of NAND memory strings, wherein the NROM memory cells are formed vertically on the sidewalls of a plurality of pillars and associated trenches formed on the substrate, and where the plurality of NROM cells are coupled into the plurality of NAND memory strings by source/drain regions formed at the top of the plurality of pillars and at the bottom of the associated trenches, wherein the source/drain regions formed at the bottom of the associated trenches have first and second edges that extend beyond opposite sidewalls of their respective trenches;
wherein a first NROM memory cell of each string is coupled to a first vertical select gate and a last NROM memory cell of each string is coupled to a second vertical select gate;
a plurality of word lines, wherein each word line is coupled to one or more gates of a row of the NROM memory cells;
a plurality of select lines, wherein each select line is coupled to one or more select gates;
at least one first bitline, wherein the at least one first bitline is coupled to a source/drain of the first select gate of each string; and
at least one second bitline, wherein the at least one second bitline is coupled to a source/drain of the second select gate of each string.

20. A method of forming a NAND architecture memory cell string, comprising:
forming one or more raised areas on a substrate, the raised areas defining associated intervening trenches;
forming a plurality of NROM memory cells on the sidewalls of the one or more raised areas;
forming one or more source/drain regions on the top of the one or more raised areas and at the bottom of the one or more associated intervening trenches, wherein the source/drain regions formed at the bottom of the associated intervening trenches have first and second edges that extend beyond opposite sidewalls of their respective trenches; and
forming a first vertical select gate coupled to a first NROM memory cell of the string and a second vertical select gate coupled to a last NROM memory cell of the string.

21. The method of claim 20, wherein forming one or more raised areas on a substrate further comprises etching a trench in the substrate.

22. The method of claim 20, wherein forming one or more raised areas on a substrate further comprises forming one or more pillars on a substrate.

23. The method of claim 22, wherein forming one or more raised areas on a substrate further comprises depositing additional substrate material on the substrate to form the one or more pillars.

24. The method of claim 20, wherein forming one or more source/drain regions on the top of the one or more raised areas and at the bottom of the one or more associated intervening trenches further comprises forming one or more source/drain regions on the top of the one or more raised areas and at the bottom of the one or more associated intervening trenches in one of before the formation of the plurality of NROM memory cells and after the formation of the plurality of NROM memory cells.

25. The method of claim 20, wherein forming a plurality of NROM memory cells on the sidewalls of the one or more raised areas and forming a first vertical select gate coupled to a first NROM memory cell of the NAND architecture memory string and a second vertical select gate coupled to a last NROM memory cell of the NAND architecture memory string further comprises forming an NROM gate-insulator stack on the surface of a first plurality of selected sidewalls and forming a first and second select gate gate-insulator stack on the surface of a second plurality of selected sidewalls.

26. The method of claim 25, wherein forming a plurality of NROM gate-insulator stack on the surface of the first plurality of selected sidewalls further comprises forming an NROM gate-insulator stack of one of oxide-nitride-oxide (ONO), oxide-nitride-aluminum oxide, oxide-aluminum oxide-oxide, oxide-silicon oxycarbide-oxide, composite layers of an oxide-an oxide of Ti, Ta, Hf, Zr, or La, and an oxide, composite layers of an oxide-a non-stoichiometric oxide of Si, N, Al, Ti, Ta, Hf, Zr, and La, and an oxide, composite layers of an oxide-a wet oxide not annealed, and an oxide, composite layers of an oxide-a silicon rich oxide, and an oxide, composite layers of an oxide-a silicon rich aluminum oxide, and an oxide, and composite layers of an oxide-a silicon oxide with silicon carbide nanoparticles, and an oxide.

27. The method of claim 25, wherein forming a plurality of NROM memory cells on the sidewalls of the one or more raised areas by forming an NROM gate-insulator stack on the surface of a first plurality of selected sidewalls and forming a first and second vertical select gate gate-insulator stack on the surface of a second plurality of selected sidewalls further comprises forming a tunnel insulator on the surface of the first plurality of selected sidewalls, forming a trapping layer on the tunnel insulator, forming a first insulator as an intergate insulator over the trapping layer, and forming a first control gate over the first insulator, and on the surface of the second plurality of selected sidewalls forming a second insulator and forming a second control gate over the second insulator.

28. The method of claim 27, wherein forming a tunnel insulator on the surface of the first plurality of selected sidewalls, forming a trapping layer on the tunnel insulator, forming a first insulator as an intergate insulator over the trapping layer, and forming a first control gate over the first insulator, and on the surface of the second plurality of sidewalls forming a second insulator and forming a second control gate over the second insulator further comprises first forming a tunnel insulator on the surface of the first plurality of selected sidewalls and forming a trapping layer on the tunnel insulator, then forming the first and second insulators over the trapping layer of the first plurality of selected sidewalls and on the surface of the second plurality of selected sidewalls, and forming the first and second control gates over the first and second insulators, wherein each layer is deposited over the two raised areas and trench, masked, and directionally etched.

29. A method of forming a NAND architecture memory array, comprising:
 forming a plurality of pillars and associated intervening trenches on a substrate;
 forming a plurality of vertical NROM memory cells on a first plurality of selected sidewalls of the plurality of pillars;
 forming a plurality of select gates on a second plurality of selected sidewalls of the plurality of pillars; and
 forming one or more source/drain regions on the top of the plurality of pillars and at the bottom of the associated intervening trenches to form a plurality of NAND architecture memory strings, wherein the source/drain regions formed at the bottom of the associated intervening trenches have first and second edges that extend beyond opposite sidewalls of their respective trenches.

30. The method of claim 29, further comprising:
 forming a P-well isolation region under each memory string.

31. The method of claim 29, further comprising:
 forming an isolation region between adjacent memory strings.

32. The method of claim 31, further comprising:
 forming a plurality of word lines and a plurality of select lines across the isolation region between adjacent memory strings, wherein each word line is coupled to a control gate of a single NROM memory cell of each memory string and each select line is coupled to a select gate of each memory string.

33. The method of claim 32, further comprising:
 forming at least one first bitline, wherein the at least one first bitline is coupled to a source/drain of a first select gate of each memory string; and
 forming at least one second bitline, wherein the at least one second bitline is coupled to a source/drain of a second select gate of each memory string.

34. The method of claim 32, further comprising:
 forming at least one bitline, wherein the at least one bitline is coupled to a drain of a first select gate of each memory string; and
 forming at least one source line, wherein the at least one source line is coupled to a source of a second select gate of each memory string.

35. The method of claim 29, wherein forming a plurality of vertical NROM memory cells on the first plurality of selected sidewalls and forming a plurality of select gates on a second plurality of selected sidewalls further comprises forming an NROM gate-insulator stack on the surface of the first plurality of selected sidewalls and forming a select gate gate-insulator stack on the surface of the second plurality of selected sidewalls.

36. The method of claim 35, wherein forming an NROM gate-insulator stack on the surface of the first plurality of selected sidewalls further comprises forming an NROM gate-insulator stack of one of oxide-nitride-oxide (ONO), oxide-nitride-aluminum oxide, oxide-aluminum oxide-oxide, oxide-silicon oxycarbide-oxide, composite layers of an oxide-an oxide of Ti, Ta, Hf, Zr, or La, and an oxide, composite layers of an oxide-a non-stoichiometric oxide of Si, N, Al, Ti, Ta, Hf, Zr, and La, and an oxide, composite layers of an oxide-a wet oxide not annealed, and an oxide, composite layers of an oxide-a silicon rich oxide, and an oxide, composite layers of an oxide-a silicon rich aluminum oxide, and an oxide, and composite layers of an oxide-a silicon oxide with silicon carbide nanoparticles, and an oxide.

37. The method of claim 35, wherein forming an NROM gate-insulator stack on the surface of the first plurality of selected sidewalls and forming a select gate gate-insulator stack on the surface of the second plurality of selected sidewalls further comprises forming a tunnel insulator on the surface of the first plurality of selected sidewalls, forming a trapping layer on the tunnel insulator, forming an intergate insulator over the trapping layer, and forming a control gate over the intergate insulator and forming an insulator on the surface of the second plurality of selected sidewalls and forming a control gate over the insulator.

38. A method of forming a memory device, comprising:
   forming a plurality of pillars and associated intervening trenches on a substrate;
   forming a plurality of vertical NROM memory cells on a first plurality of selected sidewalls of the plurality of pillars;
   forming a plurality of select gates on a second plurality of selected sidewalls of the plurality of pillars; and
   forming one or more source/drain regions on the top of the plurality of pillars and at the bottom of the associated intervening trenches to form a plurality of NAND architecture memory strings, wherein the source/drain regions formed at the bottom of the associated intervening trenches have first and second edges that extend beyond opposite sidewalls of their respective trenches.

39. A method of forming an NROM NAND architecture memory cell string, comprising:
   forming a plurality of pillars and associated intervening trenches on a substrate by depositing a layer of masking material, patterning the masking material, and anisotropically etching the substrate;
   diffusing a dopant material into the bottom of each trench to form source/drain regions, wherein the source/drain regions formed at the bottom of the associated intervening trenches have first and second edges that extend beyond opposite sidewalls of their respective trenches; and
   forming a NAND architecture NROM memory cell string having a plurality of NROM memory cells and one or more select gates, where the string is formed by,
   depositing a layer of tunnel insulator material over the plurality of pillars and intervening trenches;
   masking and anisotropically etching the layer of tunnel insulator material to form a tunnel insulator of an NROM memory cell on a first selected number of sidewalls of the pillars;
   depositing a layer of trapping layer material over the plurality of pillars and intervening trenches;
   masking and anisotropically etching the layer of trapping layer material to form a trapping layer on the tunnel insulator on the first selected number of sidewalls;
   depositing a layer of gate insulator material over the plurality of pillars and intervening trenches;
   masking and anisotropically etching the layer of gate insulator material to form a gate insulator on the NROM memory cells on the first selected number of sidewalls and gate insulator of a select gate on a second selected number of sidewalls of the pillars;
   depositing a layer of gate material over the plurality of pillars and intervening trenches; and
   masking and anisotropically etching the layer of gate material to form a control gate on the gate insulator material the first and second selected numbers of sidewalls.

40. The method of claim 39, further comprising: diffusing a dopant material into the top of each pillar to form source regions and drain regions of the one or more select gates and the plurality of NROM memory cells.

41. A NAND architecture NROM memory cell string, comprising:
   a means for defining two or more raised areas and one or more trenches on a substrate;
   a plurality of NROM memory cells, wherein the plurality of NROM memory cells are vertically formed on the sidewalls of the one or more trenches;
   wherein the plurality of NROM memory cells are coupled in a serial string by one or more means for coupling formed at the top of the two or more raised areas and at the bottom of the one or more trenches, wherein the means for coupling formed at the bottom of the one or more trenches have first and second edges that extend beyond opposite sidewalls of their respective trenches; and
   wherein a first NROM memory cell of the string is coupled to a first means for selecting the string.

42. The NROM memory cell string of claim 41, wherein a last NROM memory cell of the string is coupled to a second means for selecting the string.

43. The NROM memory cell string of claim 41, wherein the raised areas are pillars.

44. The NROM memory cell string of claim 41, wherein the NROM memory cell string is formed on a means for isolation.

45. A NAND architecture NROM memory cell string, comprising:
   a substrate, comprising two or more raised areas, defining trenches therebetween;
   a plurality of NROM memory cells, wherein the NROM memory cells are formed vertically on the sidewalls of the trenches; and
   wherein the plurality of NROM memory cells are coupled in a serial string by source/drain regions formed at the top of the one or more raised areas and at the bottom of the one or more trenches, wherein the source/drain regions formed at the bottom of the one or more trenches have first and second edges that extend beyond opposite sidewalls of their respective trenches.

46. The NROM memory cell string of claim 45, wherein the raised areas are pillars.

47. The NROM memory cell string of claim 45, further comprising:
   a plurality of word lines, wherein each word line is coupled to a control gate of an NROM memory cell of the string;
   a first bitline, wherein the first bitline is coupled to a first NROM memory cell of the string; and
   a second bitline, wherein the second bitline is coupled to a last NROM memory cell of the string.

48. The NROM memory cell string of claim 45, further comprising:
   a plurality of word lines, wherein each word line is coupled to a control gate of an NROM memory cell of the string;
   a first bitline, wherein the first bitline is coupled to a first NROM memory cell of the string; and a source line, wherein the source line is coupled to a last NROM memory cell of the string.

49. The NROM memory cell string of claim 45, wherein the NROM memory cell string is formed on an isolation region.

50. A method of forming a NAND architecture memory cell string, comprising:
   forming two or more raised areas on a substrate, the raised areas defining associated intervening trenches;
   forming a plurality of NROM memory cells on the sidewalls of the one or more raised areas; and
   forming one or more source/drain regions on the top of the one or more raised areas and at the bottom of the one or more associated intervening trenches, wherein the source/drain regions formed at the bottom of the associated intervening trenches have first and second edges that extend beyond opposite sidewalls of their respective trenches.

51. The method of claim 50, wherein forming one or more raised areas on a substrate further comprises etching a trench in the substrate.

52. The method of claim 50, wherein forming one or more raised areas on a substrate further comprises forming one or more pillars on a substrate.

53. The method of claim 52, wherein forming one or more raised areas on a substrate further comprises depositing additional substrate material on the substrate to form the one or more pillars.

54. The method of claim 50, further comprising forming a first vertical select gate coupled to a first NROM memory cell of the NAND architecture memory string and a second vertical select gate coupled to a last NROM memory cell of the NAND architecture memory string.

55. The method of claim 54, wherein forming a plurality of NROM memory cells on the sidewalls of the one or more raised areas further comprises forming an NROM gate-insulator stack on the surface of a first plurality of selected sidewalls.

56. The method of claim 55, wherein forming a plurality of NROM memory cells on the sidewalls of the one or more raised areas by forming an NROM gate-insulator stack on the surface of a first plurality of selected sidewalls further comprises forming a tunnel insulator on the surface of the first plurality of selected sidewalls, forming a trapping layer on the tunnel insulator, forming a first insulator as an intergate insulator over the trapping layer, and forming a first control gate over the first insulator.

57. The method of claim 56, wherein forming a tunnel insulator on the surface of the first plurality of selected sidewalls, forming a trapping layer on the tunnel insulator, forming a first insulator as an intergate insulator over the trapping layer, and forming a first control gate over the first insulator further comprises first forming a tunnel insulator on the surface of the first plurality of selected sidewalls and forming a trapping layer on the tunnel insulator, then forming the first and second insulators over the trapping layer of the first plurality of selected sidewalls, wherein each layer is deposited over the raised areas and trenches, masked, and directionally etched.

* * * * *